(12) United States Patent
Zhang et al.

(10) Patent No.: US 12,375,047 B2
(45) Date of Patent: *Jul. 29, 2025

(54) RADIO-FREQUENCY POWER GENERATOR AND CONTROL METHOD

(71) Applicant: Massachusetts Institute of Technology, Cambridge, MA (US)

(72) Inventors: Haoquan Zhang, Mountain View, CA (US); Anas Al Bastami, Cambridge, MA (US); David J. Perreault, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/667,152

(22) Filed: May 17, 2024

(65) Prior Publication Data
US 2024/0305254 A1 Sep. 12, 2024

Related U.S. Application Data

(63) Continuation of application No. 18/299,808, filed on Apr. 13, 2023, now Pat. No. 12,028,029, which is a
(Continued)

(51) Int. Cl.
*H03F 3/21* (2006.01)
*H03F 3/217* (2006.01)

(52) U.S. Cl.
CPC ........... *H03F 3/211* (2013.01); *H03F 3/2178* (2013.01); *H03F 2200/451* (2013.01)

(58) Field of Classification Search
CPC .... H03F 3/211; H03F 3/2178; H03F 2200/451
See application file for complete search history.

(56) References Cited

U.S. PATENT DOCUMENTS

| 7,719,377 B2 | 5/2010 | Luu et al. |
| 8,164,384 B2 | 4/2012 | Dawson et al. |

(Continued)

FOREIGN PATENT DOCUMENTS

TW         I 487270        10/2011

OTHER PUBLICATIONS

Extended European Search Report dated Nov. 18, 2024, for European Patent Application No. 21849794.9; 11 pages.
(Continued)

*Primary Examiner* — William Hernandez
(74) *Attorney, Agent, or Firm* — Daly, Crowley, Mofford & Durkee, LLP

(57) ABSTRACT

A power generator includes a plurality of amplifier blocks and a combiner. Each of the amplifier blocks include one or more amplifiers, and the combiner combines modulated power signals output from the amplifier blocks to generate an RF power signal of a load. The amplifier blocks are controlled to outphase the modulated power signals based on a phase angle. Ones of the amplifier blocks may perform discrete modulation to generate a respective one of the modulated power signals. The discrete modulation includes selecting different combinations of the amplifiers in one or more of the amplifier blocks to change the RF power signal in discrete steps. In embodiments, the amplifiers may be radio frequency power amplifiers.

20 Claims, 16 Drawing Sheets

Related U.S. Application Data continuation of application No. 17/390,212, filed on Jul. 30, 2021, now Pat. No. 11,664,773.

(60) Provisional application No. 63/085,432, filed on Sep. 30, 2020, provisional application No. 63/059,532, filed on Jul. 31, 2020.

(56) References Cited

U.S. PATENT DOCUMENTS

| | | | |
|---|---|---|---|
| 8,824,978 | B2 | 9/2014 | Briffa et al. |
| 8,957,727 | B2 | 2/2015 | Dawson et al. |
| 9,020,453 | B2 | 4/2015 | Briffa et al. |
| 9,166,536 | B2 * | 10/2015 | Briffa .................. H03F 3/245 |
| 9,923,518 | B2 | 2/2018 | Perreault et al. |
| 10,075,064 | B2 * | 9/2018 | Perreault ............ H02M 1/4208 |
| 10,790,784 | B2 * | 9/2020 | Jurkov .................... H03F 1/565 |
| 11,664,773 | B2 | 5/2023 | Zhang et al. |
| 11,909,358 | B1 * | 2/2024 | Perreault ................. H03F 3/211 |
| 2003/0125065 | A1 | 7/2003 | Barak et al. |
| 2005/0110590 | A1 | 5/2005 | Korol et al. |
| 2010/0117727 | A1 * | 5/2010 | Dawson .................. H03F 3/602 330/124 R |
| 2011/0187437 | A1 * | 8/2011 | Perreault ............... H03F 1/0294 327/355 |
| 2011/0260797 | A1 | 10/2011 | Lee et al. |
| 2011/0273234 | A1 | 11/2011 | van der Heijden et al. |
| 2013/0038389 | A1 | 2/2013 | Sorrells et al. |
| 2014/0132354 | A1 | 5/2014 | Briffa et al. |
| 2014/0269892 | A1 | 9/2014 | Ma et al. |
| 2014/0333375 | A1 | 11/2014 | Karthaus |
| 2015/0171768 | A1 * | 6/2015 | Perreault ............... H02M 7/537 330/251 |
| 2015/0194940 | A1 | 7/2015 | Briffa et al. |
| 2016/0164466 | A1 * | 6/2016 | Briffa ........................ H03F 3/24 330/295 |
| 2017/0366148 | A1 | 12/2017 | Jang et al. |
| 2019/0173438 | A1 | 6/2019 | Kiehl et al. |
| 2019/0326093 | A1 | 10/2019 | Gurov et al. |
| 2020/0212848 | A1 * | 7/2020 | Lemberg ............... H03F 1/0294 |
| 2021/0119587 | A1 * | 4/2021 | Watkins .................... H03F 3/72 |
| 2021/0408981 | A1 * | 12/2021 | Watkins ................ H03F 3/2178 |
| 2023/0246607 | A1 | 8/2023 | Zhang et al. |

OTHER PUBLICATIONS

Barton et al., "Transmission-Line-Based Multi-Way Lossless Power Combining and Outphasing System"; IEEE MTT-S International Microwave Symposium; Jun. 2014; 4 pages.
Jurkov et al., "Tunable Matching Networks Based on Phase-Switched Impedance Modulation"; IEEE Transactions on Power Electronics, vol. 35, No. 10; Oct. 2020; 18 pages.
Al Bastami, "Efficient Radio Frequency Power Generation and Impedance Matching," PhD Dissertation, Massachusetts Institute of Technology, Sep. 2020; Part 1, pp. 1-130.
Al Bastami, "Efficient Radio Frequency Power Generation and Impedance Matching," PhD Dissertation, Massachusetts Institute of Technology, Sep. 2020; Part 2, pp. 131-261.
Al Bastami et al., "A 1.5 kW Radio-Frequency Tunable Matching Network Based on Phase-Switched Impedance Modulation," IEEE Open Journal of Power Electronics vol. 1, Apr. 16, 2020, 15 Pages.
Al Bastami et al., "Dynamic Matching System for Radio-Frequency Plasma Generation," 2016 IEEE Energy Conversion Congress and Exposition, Sep. 2016, 7 Pages.
Barton et al., "Experimental Validation of a Four-Way Outphasing Combiner for Microwave Power Amplification," IEEE Microwave and Wireless Component Letters, vol. 23, No. 1, Jan. 2013; 3 Pages.
Barton et al. "Four-Way Microstrip-Based Power Combining for Microwave Outphasing Power Amplifiers," IEEE Transactions on Circuits and Systems I, vol. 61, No. 10, Oct. 2014; 13 Pages.
Braun et al., "A High Frequency Inverter for Variable Load Operation," IEEE Journal of Emerg. And Sel. Topics in Power Electron., vol. 7, No. 2, Jun. 2019; 16 Pages.
Chung, et al., "Asymmetric Multilevel Outphasing Transmitter using Class-E Pas with Discrete Pulse Width Modulation," 2010 IEEE MTT-S International Microwave Symposium, May 2010, 4 Pages.
Chung et al., "Resonant Converter Design Using Two-Port Passive Network: Single Frequency Design," 2018 IEEE Workshop on Modeling and Control in Power Electronics (COMPEL 18), Jun. 2018; 7 Pages.
Economou, "Pulsed Plasma Etching for Semiconductor Manufacturing." Journal of Physics D: Appl. Physics, vol. 47, No. 30, Jul. 1, 2014; 27 Pages.
Galapon, et al., "Measuring Dynamic On Resistance in GaN Transistors at MHz Frequencies," 2018 IEEE 19$^{th}$ Workshop on Control and Modeling for Power Electronics (COMPEL), Jun. 2018; 8 Pages.
Godoy et al., "A 2.4-GHz, 27-dBm Asymmetric Multilevel Outphasing Power Amplifier in 65-nm CMOS," IEEE Journal of Solid-State Circuits, vol. 47, No. 10; Oct. 2012; 13 Pages.
Godoy et al., "Outphasing Energy Recovery Amplifier with Resistance Compression for Improved Efficiency," IEEE Transactions on Microwave Theory and Techniques, vol. 57, No. 12, Dec. 2009; 12 Pages.
Han et al., "Resistance Compression Networks for Radio-Frequency Power Conversion," IEEE Transactions on Power Electronics, vol. 22, No. 1, Jan. 2007; 13 Pages.
Jurkov et al., "Lossless Multi-Way Power Combining and Outphasing for High-Frequency Resonant Inverters," IEEE Transactions on Power Electronics, vol. 29, No. 4, Apr. 2014; 16 Pages.
Kumar et al., "A High-Frequency Inverter Architecture for Providing Variable Compensation in Wireless Power Transfer Systems," IEEE, Mar. 2018, 6 Pages.
Perreault, "A New Architecture for High-Frequency Variable-Load Inverters," 2016 IEEE Workshop on Control and Modeling for Power Electronics (COMPEL16), Jun. 2016, 8 Pages.
Perreault, "A New Power Combining and Outphasing Modulation System for High-Efficiency Power Amplification," IEEE Transaction on Circuits and Systems I, Regular Papers, vol. 58, No. 8; Feb. 11, 2011; 4 Pages.
Rivas et al., "A High-Frequency Resonant Inverter Topology With Low-Voltage Stress," IEEE Transactions on Power Electronics, vol. 23, No. 4, Jul. 2008, 13 Pages.
Roslaniec et al., "Design of Single-Switch inverters for Variable Resistance/Load Modulation Operation," IEEE Transactions on Power Electronics, vol. 30, No. 6, Jun. 2015; 15 Pages.
Sokal, "Class-E RF Power Amplifiers," QEX, Jan./Feb. 2001, 12 Pages.
Zulauf et al., "Active Power Device Selection in High- and Very-High-Frequency Power Converters," IEEE Transactions on Power Electronics, Oct. 8, 2018, 16 Pages.
Zulauf et al., "$C_{oss}$ Losses in 600 V GaN Power Semiconductors in Soft-Switched, High- and Bery-High- Frequency Power Converters," IEEE Transactions on Power Electronics, vol. 33, No. 12, Dec. 2018; 16 Pages.
Taiwan Non-Final Office Action (with English Translation) dated Jan. 6, 2022 for Taiwan Application No. 110128131; 27 Pages.
PCT International Search Report and Written Opinion dated Nov. 18, 2021 for International Application No. PCT/US 2021/043844; 9 Pages.
Response (with Machine English Translation of Response and with Amended Claims in English) to Taiwan Office Action dated Jan. 6, 2022 for Taiwan Application No. 110128131; Response filed on Apr. 8, 2022; 66 Pages.
Decision of Rejection in Primary Examination (with English Translation) for Taiwan Application No. 110128131; filed on Apr. 8, 2022; 10 Pages.
Office Action dated Nov. 2, 2023, for U.S. Appl. No. 18/299,808; 12 pages.
Response to Office Action dated Nov. 2, 2023, for U.S. Appl. No. 18/299,808; Response filed Feb. 2, 2024; 9 pages.

\* cited by examiner

RADIO-FREQUENCY POWER GENERATOR AND CONTROL METHOD

CROSS-REFERENCE TO RELATED APPLICATIONS

This application is a continuation of and claims priority to U.S. application Ser. No. 18/299,808, filed Apr. 13, 2023, which is a continuation of and claims priority to U.S. application Ser. No. 17/390,212, filed Jul. 30, 2021, and issued on May 30, 2023, as U.S. Pat. No. 11,664,773, which claims benefit under 35 U.S.C. § 119 to U.S. Provisional Application No. 63/085,432 filed Sep. 30, 2020, and to U.S. Provisional Application No. 63/059,532 filed Jul. 31, 2020. The contents of said applications are incorporated herein by reference in their entireties.

FIELD

One or more embodiments described herein relate to power generation.

BACKGROUND

For many industrial applications, power amplifiers operate at variable load impedances, high frequency ranges, and high power levels and peak-to-average power ratios. An example of such application is plasma generation used for semiconductor processing. Existing power generators are unable to perform in a way that does not limit, or otherwise adversely affect, operation of the plasma generator or their own operation. For example, existing power generators sacrifice efficiency in order to meet other metrics. This increases size and power ratings, and results in poor peak and average power efficiency, among other limitations.

SUMMARY

One or more embodiments described herein provide a radio frequency (RF) power generator having a unique system architecture and power control methodology.

In accordance with one or more embodiments, a power generator includes a plurality of amplifier blocks, each including one or more amplifiers and a combiner to combine modulated power signals output from the plurality of amplifier blocks to generate an RF power signal of a load. The plurality of amplifier blocks are configured to outphase the modulated power signals based on a phase angle. Each of the plurality of amplifier blocks is configured to perform discrete modulation to generate a respective one of the modulated power signals. The discrete modulation includes selecting different combinations of the plurality of power amplifiers to change the RF power signal in discrete steps to correspond to changes power of the load. In embodiments, the amplifiers may be RF power amplifiers.

In accordance with one or more embodiments, a method for managing power includes
generating a first modulated power signal from a first amplifier block, generating a second modulated power signal from at least a second amplifier block, outphasing the first and second modulated power signals based on a phase angle, and generating an RF power signal for a load based on the outphased first and second modulated power signals. Generating the first modulated power signal includes switching different combinations of a plurality of amplifiers in the first amplifier block, and generating the second modulated power signal includes switching different combinations of a plurality of amplifiers in the second amplifier block. In embodiments, the amplifiers may be RF power amplifiers.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

One or more embodiments described herein provide a radio frequency (RF) power generator that satisfies the power requirements of various applications. Throughout various implementations, one or more of the following features may be combined: (1) outphasing of power signals from multiple amplifier blocks for fast-response (and, if desired, continuous) power generation, (2) configuring each multiple amplifier block to include a plurality of amplifiers, (3) configuring each multiple amplifier block to include a plurality of switched-mode power amplifiers, (4) modulating power signals by switching (or selecting) different combinations of amplifiers in each block, to produce discrete steps in the voltage of the RF power signal and/or (5) performing discrete drain modulation of supply voltages for the amplifier blocks to produce a high-efficiency operating power range.

In one embodiment, the RF power generator may be used to power a load which includes a plasma generator of a type used during a semiconductor chip fabrication process. In other embodiments, the RF power generator may power other types of loads, including ones operating in various power ranges, e.g., ones that does not have the same power range and performance requirements of a plasma generator. Moreover, the discrete step changes in the RF power signal may be dynamically performed to satisfy changing power requirements of the load over time. In some embodiments, an impedance transformer may be included to resolve any matching issues caused by changing load impedance and/or changes in impedance caused by switching different combinations of power amplifiers in the amplifier blocks during discrete modulation.

Figure 1:
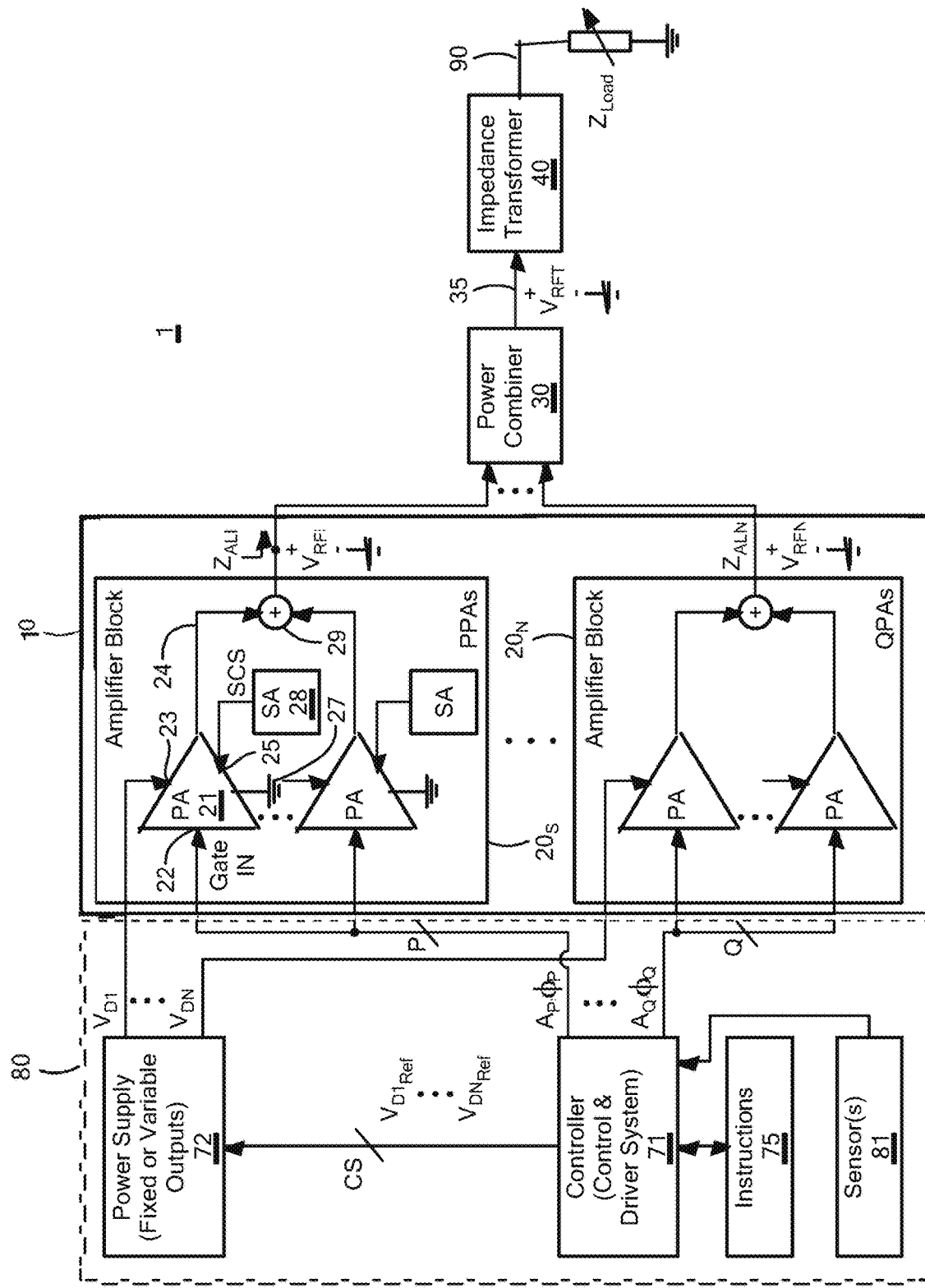
FIG. 1 is a block diagram, of a radio frequency (RF) power generator.

FIG. 1 shows an embodiment of the RF power generator 1 which includes various stages for generating power for an intended application. One application may be, as stated, an industrial application such as generating power for a plasma generator in a semiconductor manufacturing process. Other applications may be various types of communications and antenna systems, radar systems, and microwave cavity resonators as well as others.

Referring to FIG. 1, the RF power generator 1 includes an amplifier stage 10, a power combiner 30, and an impedance transformer 40. The amplifier stage includes N amplifier blocks (where N≥2) that output modulated power signals that are combined to generate output RF power signal for a load. Each of the N amplifier blocks includes a plurality of power amplifiers which are selectively switched (e.g., selected or activated) to generate predetermined power block voltages. An example of a first amplifier block will be discussed with the understanding that remaining ones of the N amplifier blocks may be configured in the same or a similar manner. In other embodiments, the amplifier blocks may have different structural and/or function configurations.

The first amplifier block $20_1$ includes a plurality of power amplifiers PA arranged in parallel. For convenience, only one power amplifier 21 is shown in detail in block $20_1$ with the understanding that the remaining one or more power amplifiers in the block may be similarly configured. In one embodiment, the power amplifiers in each block may have an inverter configuration operating in switched-mode, instead of linear mode.

The power amplifier 21 may include a power transistor provided alone or with one or more other transistors and/or circuit elements. The power transistor may be, for example, a MOSFET having a fixed or adjustable gain, a predetermined bandwidth, power efficiency and impedance. In some implementations, the RF amplifier may be a Class D amplifier, a Class E amplifier, a Class Phi amplifier or another type of amplifier. In one embodiment, the power amplifier 21 may operate in switched-mode. In another embodiment, the power amplifier 21 may operate in a linear region, e.g., at relatively lower power level(s).

In addition, the power amplifier 21 may include a first control input 22, a power supply input 23, an RF power output 24, and a second control input 25. The first control input 22 may receive a first control signal from a control and driver system (or controller) 71. The first control signal may include a gate signal into the power transistor of the power amplifier 21. In one embodiment, the first control signal may include information indicating an amplitude A1 of the power signal (voltage) to be output and/or timing information (e.g., phase $\phi_1$) for controlling the switching mode (and outphasing) of the power transistor. In switched-mode operation, the control information may omit the amplitude. In linear-mode operation, both amplitude and phase information may be included in the first control signal. Amplitude and phase information may also be received by other power amplifiers in the block.

The power amplifier 23 receives one of a plurality of supply voltages $V_{D1}, \ldots, V_{DN}$ output from a power supply 72, where N≥2. In one embodiment, the voltage signals from the power supply 72 may correspond to fixed voltages. In another embodiment, the voltage signals from the power supply 72 may correspond to variable voltages. The other power amplifier(s) in block 20 may receive the same supply voltage as power amplifier 23 or different supply voltages. For illustrative purposes, it will be assumed that all power amplifiers in block $20_1$ receive the same supply voltage.

The power supply 72 may be configured in various ways. In one embodiment, the power supply 72 may generate regulated power supply voltages $V_{D1}, \ldots, V_{DN}$ from one or more input sources of energy. In one embodiment, power supply 72 may generate independently-controlled variable voltages as the power supply voltages $V_{D1}, \ldots, V_{DN}$, enabling modulation of the RF output voltages $V_{RFj}$ from the amplifier blocks using power supply (or drain) modulation. In this latter case, power supply 72 may provide for rapid switching among available discrete voltage levels, enabling rapid modulation of output power voltages $V_{D1}, \ldots, V_{DN}$ without the need to rapidly slew the power supply voltages. These features will be described in greater detail below.

In the embodiment of FIG. 1, the supply voltages output from power supply 72 are in one-to-one correspondence with the N amplifier blocks. Thus, the number of supply voltages may equal the number of amplifier blocks in this case. The same may or may not be true of the number of control signals output from controller 71, e.g., the control signals output from the controller may be in one-to-one correspondence with the amplifier blocks or different control (e.g., phase information) may be input into different ones of the power amplifiers of each block in order to generate an intended output power voltage from that block during outphasing. In other embodiments, these one-to-one correspondences may not exist.

The output voltage 24 of power amplifier 21 may be selectively combined with the output voltages of one or more other power amplifiers in block $20_1$ or may be output alone depending, for example, on the discrete modulation scheme (e.g., phase angle and/or the power management method) of the amplifier block being implemented. The voltages output from the power amplifiers (PAS) in block $20_1$ may, for example, be combined in a combiner 29, also included in the block. The combiner may, in turn, output a power signal (e.g., voltage $V_{RF1}$) having an amplitude equal to or different from (e.g., greater than) the voltage supplied to the power supply input 23, when amplifier 21 has a positive gain greater than one.

The power signal 24 may be an interim voltage (e.g., subject to further processing prior to input into the power combiner) or may be output as is to the power combiner. The gain of each of the power amplifiers in block $20_1$ may be set so that the power voltage output from combiner 29 lies in a predetermined range, for example, to satisfy the power requirements of the load (e.g., $Z_{Load}$), even when selectively combined with the power signals from one or more other power amplifiers in block $20_1$. The power signal output from amplifier block $20_1$ is shown as having a voltage $V_{RF1}$.

The second control input 25 is coupled to receive a second control signal in the form of a switching control signal SCS. The switching control signal may be output from a switching control circuit 28 within or coupled to the power amplifier.

In one embodiment, the switching control signal SCS performs a switching augmentation function. When a supply voltage is received from power supply 72, the power amplifier operating in switched mode converts the supply voltage to a desired RF power signal.

In addition to these features, the RF power amplifier 21 may be coupled to a reference potential or bias voltage source 27. The reference potential may be, for example, a ground potential but may be a different potential in another embodiment. Also, prior to input into the power combiner 30, the power signal $V_{RF1}$ from amplifier block $20_1$ may be passed through one or more active elements. The active elements may include reactive elements (e.g., capacitor, inductor, transmission line, etc.) which may help set the output impedance of the block. When the active elements include a capacitor, the capacitor may, for example, also serve as a noise filter and/or a smoothing capacitor. The output of the first amplifier block, $20_1$ may have a first impedance $Z_{AL,1}$, which may be fixed or vary, for example, based on the state of power amplifiers in the block $20_1$.

The remaining one(s) of the N amplifier blocks (up to block $20_N$) may have features similar to those of the first amplifier block. The output impedances of these blocks are labeled $Z_{ALj}$, where the Nth block has an output impedance of $Z_{ALN}$. Thus, in accordance with one embodiment the amplifier stage 10 may be considered to have a plurality of amplifier blocks $20_1$ to $20_N$, with the jth power block having a power supply input $V_{Dj}$ and power signal RF output $V_{RFj}$, where $1 \leq j \leq N$.

In one embodiment, the amplifier blocks may be controlled to be always on. In this case, different combinations of the power amplifiers in each block may be selectively switched to control the respective power signal outputs of the blocks. This may be accomplished, for example, based on a predetermined and/or feedback-controlled outphasing pattern. The selective switching of the power amplifiers in the amplifier blocks may be used to implement discrete modulation of the power signals output from those blocks. This, in turn, may cause the RF power signal output to the load to be changed in discrete steps.

When in linear-mode operation, both the amplitude and phase information output from controller 71 may control the power signal output from each block. Some or all of the amplitudes $A_1, \ldots, A_N$ may be the same or different from one another in this case. In switched-mode operation, only the phase $\phi_j$ may be used according to a predetermined outphasing scheme. The outphasing scheme may selectively active predetermined amplifier blocks at predetermined times to generate power signals that are combined by the power combiner for powering the load. By controlling the power amplifiers (e.g., by controlling the on/off state of the power amplifier) in each of the N amplifier blocks, the amplifier stage 10 may achieve a scalable power-generator design sufficient to satisfy the requirements of many applications.

In one embodiment, the amplifier blocks may themselves be selected (or activated) based on the control information from controller 71, along with the switching that takes place for the power amplifiers in each amplifier block. In this sense, switching (or selection) of the amplifier blocks may be considered to perform coarse adjustments to the RF power signal to the load, and switching of the power amplifiers in each of the amplifier blocks may be considered to perform fine adjustments to the RF power signal to the load. The control information controlling switching of the amplifier blocks may be used, for example, to change the state of operation (e.g., activate/deactivate or select/deselect) of and thus implement different switching combinations of the blocks.

In one embodiment, in order to improve efficiency and achieve a wide load range, the power transistors in each of the N amplifier blocks may be operated to maintain zero-voltage switching (ZVS, or soft switching) across all or a predetermined portion of the operating range of the blocks. Auxiliary circuits may be included in order to facilitate ZVS operation under varying conditions.

The power combiner 30 generates a combined power signal ($V_{RFT}$) 35 used as a basis for powering the load. The combined power signal is based on a combination of the power signals output from the amplifier stage 10, e.g., output from all or some of the N amplifier blocks. In one embodiment, the combination may be performed using a lossless (and hence non-isolating) combining method. In another embodiment, the combination may be performed using an isolating combination method coupled with energy recovery. In these or other embodiments, the power signals may be combined based on weights, or weight coefficients, assigned to respective ones of the RF power signals. The output impedance of the power combiner 30 is $Z_T$.

In one embodiment, the power combiner 30 may perform one or more operations in addition to its combining operation. For example, the power combiner may perform load modulation of the power amplifier blocks including transforming block impedances (e.g., $Z_{AL1}$ to $Z_{ALN}$), in addition to or in combination with the impedance transformation performed by impedance transformer 40. The power combiner may also perform power control and/or may narrow the operating range of the power amplifier blocks.

The impedance transformer 40 converts the output impedance of the power combiner 30 to match the impedance of the load $Z_{Load}$, at least to within a predetermined tolerance. This impedance matching operation may improve performance and efficiency of the transfer of RF power to the load. The characteristics of the load may control the impedance transformation to be performed. For example, the load impedance range associated with a given application may determine the voltage and/or current levels corresponding to the load. These voltages and/or current levels may be rescaled to ones more suitable for efficient synthesis, e.g., to rescale the load impedance to a more suitable range. In one embodiment, the impedance transformer 40 may perform a fixed or variable impedance transformation for this purpose. To accomplish this, impedance transformer 40 may include a tunable matching network (TMN) or a resistance compression network. The output impedance of transformer 40 may match (or substantially match) the impedance of load $Z_{Load}$. In addition, in one embodiment the signal output from the impedance transformer 40 may correspond to the RF power signal 90 provided to the load.

The RF power generator 10 may include a number of additional features. For example, the RF power generator may include, or be coupled to, a control system 80. The control system may include, for example, the controller 71 and power supply 72 previously discussed. In addition, the control system 80 may include one or more sensors 81 for measuring parameters including, but not limited to, the following: output voltage, current and power corresponding to $V_{RFout}$, ZVS detection and monitoring of the power amplifier transistors, and/or system temperatures. Accurate high-bandwidth measurement of voltage and current (or direct measurement of RF power) under variable load conditions may be beneficial for controlling output power even more accurately with an even faster response time in some embodiments. For example, control system 80 may include a feedback loop from the sensor(s) to the controller 71 for dynamically changing power signal generation from the amplifier stage 10, in order to meeting changing load, impedance and/or power requirements of the load or to compensate for various conditions of the RF power generator, e.g., in order to maintain the various components of the RF power generator operating in one or more predetermined ranges.

The sensor(s) 81 input their measured values into controller 71. Depending on the system, controller 71 may generate various types of control signals CS for output to the power supply 72. In one embodiment, the control signals may select or vary all or a portion of the voltages $V_{D1}, \ldots, V_{DN}$ to be supplied to the amplifier blocks in stage 10. In some embodiments, this may be accomplished, in whole or part, by designating reference voltages $V_{D1,Ref}$ to $V_{DN,Ref}$. The controller 71 may also generate signals (e.g., gating signals 22) for controlling outphasing of power signals from the amplifier blocks. For switched-mode operation, the control signals may indicate switching timing and relative phase among the amplifier blocks. In a linear-mode operation, the control signals may also include the amplitudes for generating the voltages $V_{RF,1}, \ldots, V_{RF,N}$ of output power signals output to the power combiner 30. These and other features of the RF power generator 20 will now be discussed.

The amplifier stage 10 may control power generation based on a Multi-Inverter Discrete Backoff (MIDB) approach. Unlike other power generators which have been proposed, the MIDB approach allows RF power generator to losslessly combine the outputs of switched-mode power amplifier blocks arranged in parallel-, current-combined, and/or voltage-combined groups, while at the same time performing outphasing among the groups of amplifier blocks for purposes of generating the RF power signal. Such an approach enables high-bandwidth output power modulation to be performed through rapid variations in phase-shift (e.g., phase-shift may be implemented by setting the gate-driver signal delays between the power amplifier blocks, which delays can be changed at a very fast rate based on corresponding control signal commands), thereby increasing reliability, performance and power efficiency.

In combination with these benefits, one or more embodiments of the RF power generator 1 may compensate for both voltage-related losses and current-related losses, a performance benefit not achievable by other RF power generators. As a result, greater efficiency may be achieved, especially at relatively lower power levels. For example, other proposed power amplifiers operate at full voltage. As a result, loss components relating to supply voltage (e.g., device output capacitor losses, resonant losses, etc.) are not reduced and thus are not compensated for. This lack of compensation has an adverse effect on efficiency especially at reduced power levels. In contrast, and in accordance with one or more embodiments, RF power generator 1 may compensate for voltage-related losses across a wide range including relatively lower power levels, as well as for current-related losses. Also, RF power generator 1 may achieve a wider range of output power backoff (e.g., encompassing large ratios of 30 dB or more). For these and other reasons, RF power generator 1 may be suitable for a wider variety of applications, including, but not limited to, ones having high peak-to-average power ratios. Embodiments of the MIDB approach will now be discussed.

The MIDB approach may be implemented to perform discrete modulation for an outphasing pattern. In this approach, the power amplifiers in each amplifier block generate a respective number of rf voltage vectors of fixed (or substantially fixed) magnitude. By changing (or switching) the number of power amplifiers that are active within one or more of the N amplifier blocks and by then combining the power signals from the blocks, discrete steps in the voltage of the output RF power signal 90 may be performed. As a result, outphasing angle may always be maintained within a predetermined range, which allows for a greater level of efficiency (and ideally, a substantially greater level of efficiency) to be achieved and at the same time a wider backoff range.

To further extend the output power range while achieving high efficiency, in one or more embodiments the RF power generator 1 may perform modulation in the power supply 71. For example, discrete drain modulation may be performed, where the supply voltage input into one or more of the amplifier blocks is switched among a number of discrete levels. Outphasing may then be used with the MIDB approach (implemented in all or some of the blocks) to provide continuous control over a predetermined output power range corresponding to the load. This may be accomplished, for example, by interpolating between power levels obtained with various discrete supply voltage levels.

In terms of output power control, the combined discrete drain modulation and MIDB approach may provide an additional basis for performing discrete steps in RF voltage magnitude to be outphased from each block. This may allow the MIDB architecture to be highly modular and may mitigate supply generation and modulation overhead, even at relatively low-power levels. Moreover, in one or more embodiments the generation of discrete supply voltages may be adapted in a continuous fashion, e.g., the supply modulation actions may be controlled to take place on a time scale which, for example, may be much slower than that used for high-speed power control.

Figure 2:
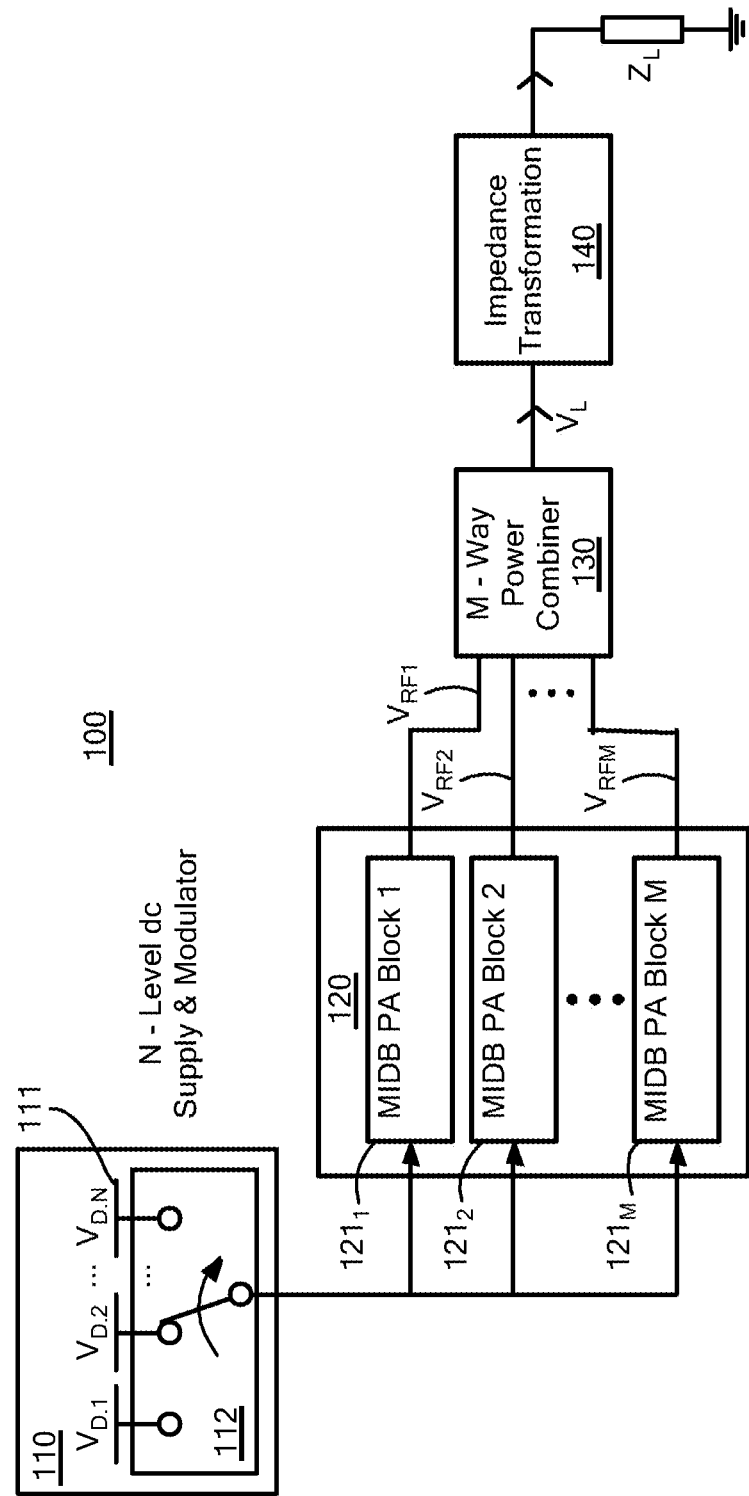
FIG. 2 is a block diagram of an RF power generator.

FIG. 2 illustrates an example embodiment of an RF power generator 100. That is, the embodiment of FIG. 2 may be one implementation of the RF power generator of FIG. 1. In this example embodiment, the RF power generator 100 implements the MIDB approach combined with outphasing of the amplifier blocks.

Referring to FIG. 2, the RF power generator 100 includes a power supply 110, an amplifier stage 120, a power combiner 130, and an impedance transformer 140. The power supply 110 may include a plurality of power sources 111 and an optional modulator 112 which may include one or a plurality of switches. The power sources output voltages at N discrete voltage levels, and the modulator 112 modulates the N discrete voltages for output to the amplifier stage 120. In one embodiment, the modulator 112 performs discrete drain modulation for the N discrete voltages output from the power sources 111. An embodiment of discrete drain modulation is discussed in greater detail below.

The amplifier stage 120 includes a plurality (M) of MIDB amplifier blocks $121_1$ to $121_M$, where M>1. Each of the amplifier blocks may include a plurality of parallel-combined RF power amplifiers, so that the output RF power signals having voltages $V_{RF,1}, \ldots, V_{RF,M}$ of each of the blocks can be discretely modulated.

Figure 3A:
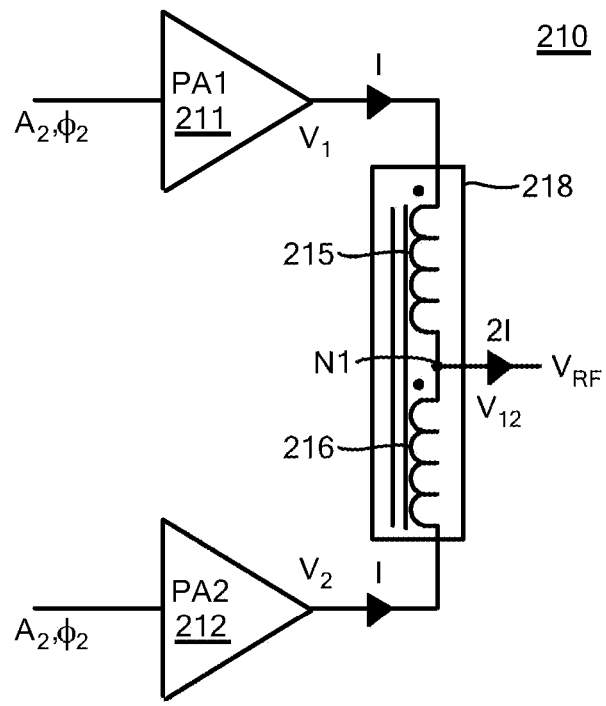
FIGS. 3A to 3C are a series of schematic diagrams of various embodiments of amplifiers having outputs combined via one or more combiners.
Figure 3B:
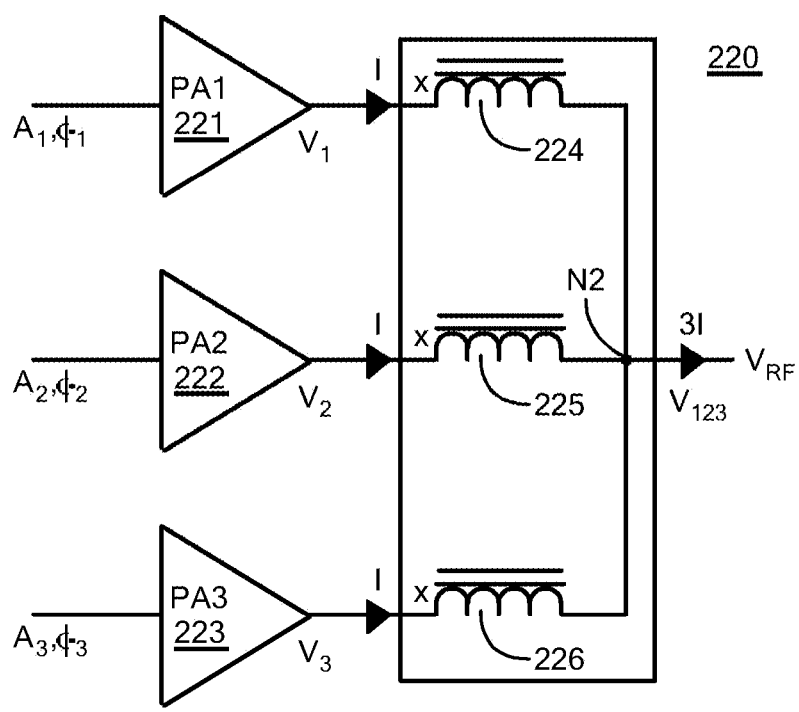
Figure 3C:
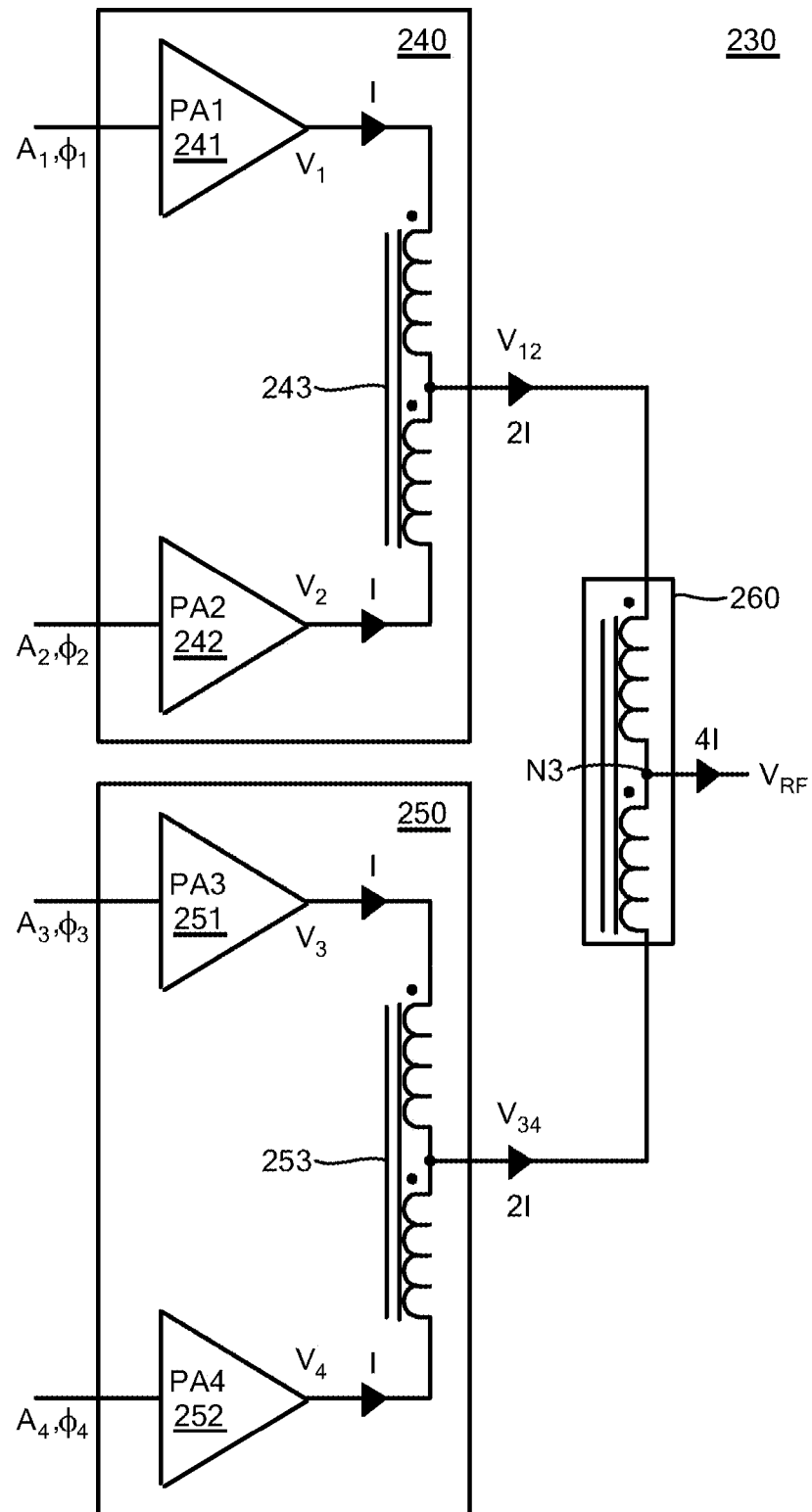

FIGS. 3A to 3C show various embodiments how each of the MIDB blocks $121_1$ to $121_M$ may be configured. FIG. 3A shows a block of one such configuration which includes two modular power amplifiers, namely power amplifier (PA1) 211 and power amplifier (PA2) 212, and a combiner 218. The power amplifiers 211 and 212 may have a structure as shown, for example, in FIG. 1 and may output respective voltages $V_1$ and $V_2$ and, in this example case, the same current I. The power amplifiers 211 and 212 may be controlled to perform discrete modulation of the output voltage of the block. This may be accomplished, for example, by controlling the on/off states of the power amplifiers to achieve a desired modulation. The on/off states of the power amplifiers 211 and 212 may be controlled, for example, based on the control information output from a controller, e.g., gating signals, phase values φ and/or other information output from controller 71.

In one embodiment, a power amplifier may be held in its off state by holding one or more of its transistors in a fixed gating state (e.g., holding a particular switch "on" by application of a bias (or control) signal to the transistor and in particular by application of a bias (or control) signal to one or more electrodes of the transistor). When operating (on), the power amplifiers may have fixed relative phases (e.g., $\phi_1-\phi_2$) based on the desired combiner type (e.g., in-phase for the shown combiner, in quadrature, 180 degrees out of phase or some other relative phase relationship), with their average phase controlled to provide outphasing among MIDB blocks. Alternatively, the relative phases may also be adjusted in operation. In this way, the respective output voltages $V_1$ and $V_2$ of the power amplifiers 211 and 212 may be selected (e.g., activated or switched) based on different phases ($\phi_1$ and $\phi_2$, which, for example, may be the same for the embodiment shown in FIG. 3A) to generate, once combined, a desired modulated power signal output of the block.

Stated differently, the PA(s) within an MIDB block may be either active (on) or inactive (off or ac-grounded) based on control. Active PAs within the same MIDB block may, for example be switched synchronously as shown in FIG. 3A-C (or exactly 180° apart if an alternative combiner type is used). With respect to outphasing, where phases are different, this may happen between $V_{rf1}-V_{rfM}$, i.e. after the MIDB block.

As noted above, in embodiments, the relative phase relationships may be fixed or selected in combination with a desired combiner structure (including, but not limited to relative phase of: in-phase, 180 degrees out of phase, in-quadrature, and/or 45 or 135 degrees out of phase), but may have their phases adjusted together to provide outphasing with respect to different blocks. In the combiner shown in FIG. 3A, it would generally be desirable to have the power amplifier controls in phase. In embodiments, one could add an option to allow adjustable relative phase within a block, but this would be a less than usual condition. It should be appreciated that individual amplifiers are turned on or off in response to whether their gating signals are provided or held in a constant stage. In some cases, holding a particular power amplifier switch ON is the desired state for a PA that is "off", such that it appears as a short circuit.

Thus, in one embodiment, the power amplifiers in each amplifier block may be active (on) or inactive (off or AC-grounded) based on control. The active power amplifiers within the same amplifier block may be switched synchronously (e.g., as shown in FIGS. 3A-3C (or exactly 180 degrees apart if an alternative combiner type is used). In another embodiment, the switching may be performed asynchronously. In one embodiment, phases may be different in the outphasing part. This may occur, for example, after the MIDB block. In one embodiment, the relative phase relationships may be fixed by the desired combiner structure (e.g., in phase, 180 degrees out of phase, in quadrature), but may have their phases adjusted together to provide outphasing with respect to different blocks. In the example combiner shown, the power amplifiers may be controlled in phase. In one embodiment, adjustable relative phase may be performed within one or more of the amplifier blocks. Whether or not the gating signal is received may control whether or not a corresponding power amplifier is on or off or held in a constant stage. (In some cases, holding a particular PA switch ON may be the desired state for a PA that is "off", such that it appears as a short circuit).

The combiner 218 may combine the output voltages of the power amplifiers 211 and 212 in common mode. It should be noted that the combiner 218 is illustrated as coupled-inductors to better illustrate the voltage-combining characteristic within a MIDB block, however, in practice the combiner may not necessarily be based on inductors in a traditional ac transformer. The combiner 218 may combine the output voltages of the power amplifiers 211 and 212 in common mode using a transformer-based structure such as an interphase transformer, or an rf power combiner or an RF coupler comprising transmission-line sections as in a transmission-line transformer (e.g., an rf combiner comprising transmission line sections or an rf coupler comprising transmission line sections). For example, as shown in FIG. 3A, the combiner 218 includes two windings 215 and 216 that are coupled to effectively form a transformer having a predetermined winding ratio. In this example, the combiner includes a node N1 that generates the output power signal voltage for the block. In one embodiment, the output power signal voltage of the block (e.g., one of $V_{RF1}, \ldots, V_{RFM}$) may correspond to a weighted sum (e.g., an average) of the output voltages $V_1$ and $V_2$ of the power amplifiers in the block. The output current from the amplifier block may correspond to a sum of the output currents of the power amplifiers 211 and 212, which in this example is 2 I.

FIG. 3B shows a stage 220 that may be representative of the configuration of each of the amplifier blocks. In this example embodiment, stage 220 includes three modular power amplifiers 221, 222, and 223 and a combiner 228. The power amplifiers 231 to 223 may have a structure as shown, for example, in FIG. 1 and may output respective voltages $V_1$, $V_2$, and $V_3$ and, in this example, the same current I. The power amplifiers may be controlled to perform discrete modulation of the output voltage of the block. This may be accomplished, for example, by controlling the on/off states of the individual power amplifiers to achieve a predetermined modulation. The on/off states of the power amplifiers 221, 222, and 223 may be controlled, for example, based on the control information output from the controller, e.g., gating signals output from controller 71. In this way, the respective output voltages $V_1$, $V_2$, and $V_3$ of the power amplifiers may be selected (or activated) with appropriate phases ($\phi_1$, $\phi_2$, and $\phi_3$,) and gating controls to generate, once combined, a desired modulated output power signal voltage of the block.

It should be noted that one difference between the examples shown in FIGS. 3A-C is the different number of PAs constituting the block, and also the combiner needed for achieving common-mode voltage combination (e.g. FIGS. 3A, 3C illustrates use of 2-way common-mode combiner/interphase transformers while FIG. 3B illustrates use of a 3-way common-mode combiner/interphase transformer).

The combiner 228 may combine voltages 221, 222, and 223 in common mode using an interphase-transformer-based structure (e.g., a coupled-conductor based structure). For example, as shown in FIG. 3B, the combiner 228 includes three windings (conductors) 224, 225, and 226 each arranged on a leg of a three-legged transformer core and coupled, at first ends, to the outputs of respective ones of the power amplifiers and commonly coupled, at second ends, to node N2. This results in the individual power amplifiers seeing proportional currents and the output voltage being a weighted sum of the three power amplifier voltages. The outputs of the power amplifiers are combined at node N2, which generates the output power signal voltage for the block. In one embodiment, the output voltage of the block (e.g., a corresponding one of $V_{RF,1}, \ldots, V_{RF,M}$) may correspond to a weighted sum (e.g., an average) of the output voltages $V_1$, $V_2$, and $V_3$ of the power amplifiers in the block. The output current from the power amplifier block may correspond to a sum of the output currents of the power amplifiers 321, 322, and 323, which in this example is 3I.

FIG. 3C shows a block 230 that may be representative of the configuration of each of the blocks of the amplifier stage. In this example embodiment, block 230 includes two sub-blocks 240 and 250 of power amplifiers. Each of the sub-blocks may correspond, for example, to the block of FIG. 3A, but with the output of each stage coupled to a combiner 260. The first sub-block 240 includes power amplifiers 241 and 241 having output voltages combined in a combiner 243. The second sub-block 250 includes power amplifiers 251 and 252 having output voltages combined in a combiner 253.

The power amplifiers in block 230 may be controlled to perform discrete modulation of the output power signal voltage of the block. This may be accomplished, for example, by controlling the on/off states of power amplifiers 241, 242, 251, and 252 to achieve a predetermined modulation. The on/off states may be controlled, for example, based on the control information output from the controller, e.g., switch gating signals output from controller 71. In this way, the respective output voltages $V_1$, $V_2$, $V_3$, and $V_4$ of the power amplifiers may be selected (or activated) to generate, once combined, a desired modulated output voltage of the block. (In this regard, it is noted that, in embodiments, the relative phase relations of the PAs in a block may be fixed, and rf output is modulated in discrete steps by turning on or off one or more amplifiers. The phases of the "on" amplifiers may be modulated together to outphase against a different block.) The combiner 260 combines the output voltage $V_{12}$ of the first sub-block 240 and the output voltage $V_{34}$ of the second sub-block 250. In one embodiment, combiner 260 may be similar to the combiner 213 of FIG. 3A. The output of combiner 260, from node N3, may be, for example, a weighted sum (e.g., an average) of the output voltages of sub-blocks 240 and 250 ($V_{RF}$) and a sum of the currents of those stages, which is 4 I in this example.

In one embodiment, the combiners in FIGS. 3A to 3C may be implemented using interphase transformers or transmission-line transformers. For example, each of the combiners in the MIDB amplifier blocks may be implemented using an n-way interphase transformer, or a "wiffle-tree" of 2-way interphase transformers with quarter-wave-line power combiners. In such a case, the output power signal voltage of each block may correspond to a direct average of the output voltages of the power amplifiers of that block. In the examples shown, the power amplifiers in each block have the same output current. In another embodiment, the dual of this configuration may be implemented where all of the power amplifiers in each block have equal voltage and the output current, which are summed, e.g., weighted-averaged.

For each block, peak output voltage and power may be achieved by turning on all of the power amplifiers in the block. (Similarly, peak output voltage and power from the amplifier stage may be achieved by turning on the power amplifiers in all of the blocks.) In accordance with one embodiment, the peak output voltage and power of any one block may be reduced in discrete steps by selectively turning off (e.g., de-selecting based on phase ϕ or other control information) one or more of the power amplifiers in that block. This may be accomplished, for example, based on a predetermined pattern of on/off states of the power amplifiers, the result of which is to achieve a desired modulated (or changing) block output voltage over time that satisfies load requirements. The predetermined pattern may be a symmetrically switched pattern in one embodiment, or an asymmetrically switched pattern in another embodiment. The power amplifiers may be turned off in a variety of ways. For example, each power amplifier may be turned off using an AC grounding approach.

In one embodiment, the power amplifiers (PAs) in each block output the same current (I). In another embodiment, one or more of the power amplifiers in each block may output a different current from one or more of the other power amplifiers. Also, the combiners in the amplifier blocks have been described as common-mode combiners. In one embodiment, all or a portion of the combiners in each block may be another type of combiner, e.g., a differential-mode combiner, where the output voltage of each MIDB block is based on the difference of individual ones of the power voltages in the block and the output current is the same as the current of an individual one of the power amplifiers, e.g., current I. In one embodiment, output voltage modulation using differential combiners can be achieved by implementing on/off control of the power amplifiers in each MIDB block.

It was previously indicated that MIDB amplifier blocks $121_1$ to $121_M$ may all have the same configuration, e.g., one of the configurations of FIGS. 3A to 3C. In another embodiment, one or more of the MIDB amplifier blocks may have a different configuration from the others, e.g., in one embodiment the MIDB amplifier blocks may have different ones of the configurations shown in FIGS. 3A to 3C.

Figure 4:
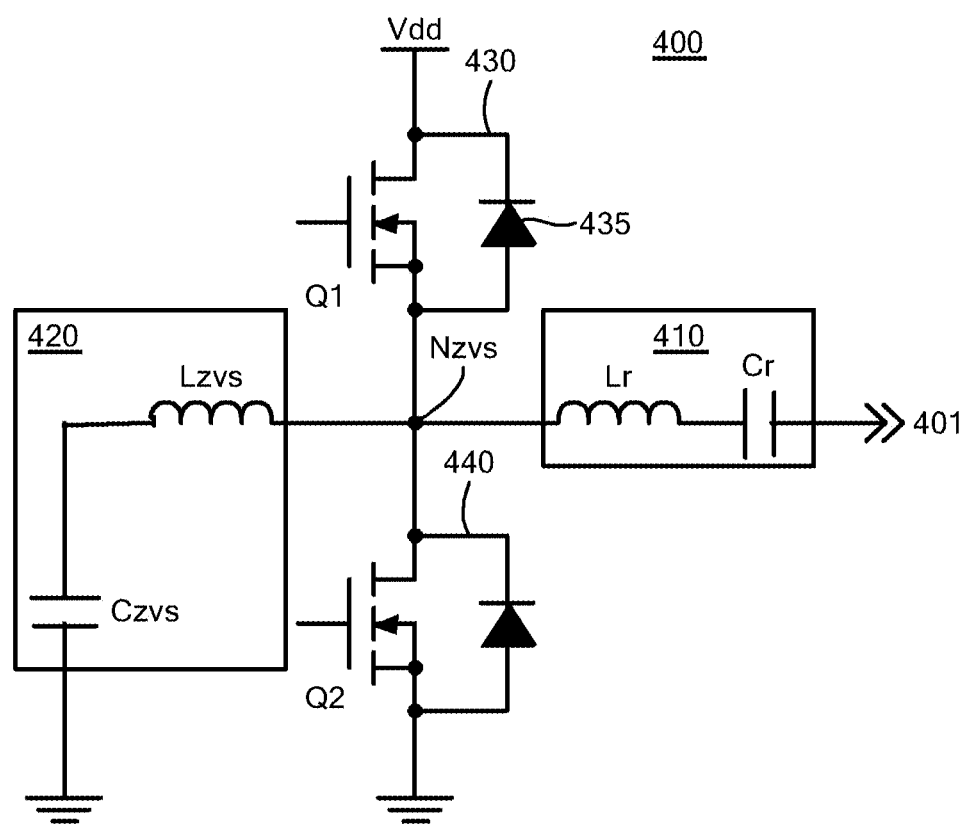
FIG. 4 is a schematic diagram of a switched-mode power amplifier (PA).

FIG. 4 shows an embodiment of a power amplifier 400 which may be used to implement the power amplifiers (PAs) in the amplifier blocks. In one embodiment, the power amplifier 21 in FIG. 1 and/or the power amplifiers (labeled PA) in each of the MIDB blocks in FIGS. 3A to 3C may include power amplifier 400. While the configuration of FIG. 4 may be used in some applications, power amplifier 400 may have a different configuration in other embodiments or applications. For a plasma generation application, power amplifier 400 may, for example, have all or a portion of the following features: (1) high (or desired) efficiency in a predetermined switching frequency range (e.g., tens of MHz), (2) efficient AC grounding for MIDB control (and/or other connections for turning off the power amplifier in an MIDB block and combiner), (3) maintain efficiency with variations in load impedance (e.g., for outphasing and easing requirements on impedance transformation), and/or (4) fast dynamic response to discrete step change in output power, e.g. a step change of outphasing angle, of on/off status, and of supply voltage level.

Referring to FIG. 4, power amplifier 400 is configured in the example of a ZVS Class-D inverter circuit which includes a filter 410, a shunt leg 420, switch 430, and switch 440. The filter 410 includes an inductor $L_r$ and a capacitor $C_r$ coupled in series to an output terminal 401, which in the case of FIGS. 3A to 3C is coupled to an associated block combiner. Based on the values of $L_r$ and $C_r$, the filter is tuned to be resonant at the associated switching frequency to filter out the fundamental components of the switching node voltage.

The shunt leg 420 provides additional inductive loading of the switching node and therefore assists the switches to achieve zero voltage switching, even when the load of the power amplifier varies, e.g., within a predetermined range. The shunt leg includes an inductor $L_{ZVS}$ and a capacitor $C_{ZVS}$ connected in series and having values sufficient to achieve zero voltage switching operation, as previously mentioned.

The switches 430 and 440 operate in switched-mode and may be implemented by transistors, each having a predetermined conductivity. Switch 430 (Q1) is coupled between a node $N_{ZVS}$ and a power supply $V_{dd}$ and, for example, may be an N-channel transistor with an intrinsic body diode or equivalent 435 for zero-voltage switching. Switch 440 (Q2) is coupled between node $N_{ZVS}$ and a reference potential 450, e.g., ground), and may also be an N-channel transistor with an intrinsic body diode or equivalent 445 for zero-voltage switching. In operation, when the power amplifier 400 is on (e.g., selected or activated), both transistors 430 and 440 are switching with each conducting, for example, for approximately half of the switching period, preferably consistent with achieving zero-voltage switching for each transistor. When the power amplifier 400 is off (e.g., not selected or activated), switch 430 is turned off and switch 440 conducts constantly. This effectively AC grounds the output and change the output voltage of the MIDB block. Note that one may invert which switch is held on and which switch is held off for the power amplifier off state if desired.

In other embodiments, the power amplifier 400 may have a different configuration. For example, the power amplifier may have a Class-E inverter structure or may be a Class-$\Phi_2$ type structure. In these structures, an additional switch may be used to disconnected the power amplifier from the input power supply when in the off state. Also, one or more of the transistors of the power amplifier (PA) may be held on to provide a desired AC ground. In other MIDB cases, different switch state settings may be used for the power amplifier in the off state. For example, in an MIDB configuration that forces equal voltages at the amplifier output(s) and averages current among the power amplifiers in the block or across blocks, the off state may be achieved by open-circuiting the power amplifier output, e.g., using a switch or by holding the amplifier transistor(s) in the off state.

Figure 5:
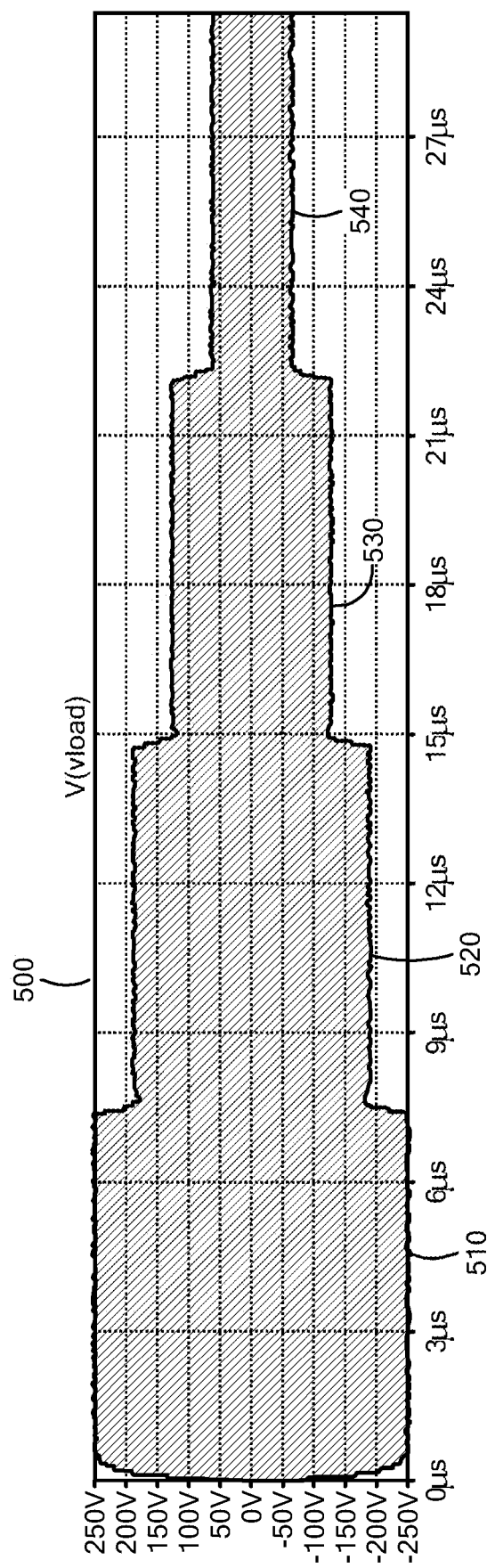
FIG. 5 is a plot of voltage vs. time for an example RF output voltage waveform of a Multi-Inverter Discrete Back-off (MIDB) block such as an MIDB block illustrated in FIG. 2 or FIG. 6.

FIG. 5 shows an example of a switching waveform 500 that may be used to selectively turn on and off (in this example) four power amplifiers in one of a power amplifier blocks $121_1$ to $121_M$, to generate the rf output voltage (Vrf) of an MIDB block with four PAs, for example, as shown in FIG. 3C. The same or different waveforms may be used for the power amplifiers in other ones of the M amplifier blocks. In this example, the switching waveform indicates a symmetrical pattern of on/off states of the power amplifiers. In section 510, the switching waveform turns on all of the power amplifiers in the MIDB block and thus the block outputs a peak voltage. In section 520, the switching waveform turns on three of the power amplifiers and turns off the remaining power amplifier. In Section 530, the switching waveform turns on two of the power amplifiers and turns off the remaining two power amplifiers. In section 540, the switching waveform turns on one of the power amplifiers and turns off the remaining three power amplifiers. Then, the waveform may repeat and may or may not be in the amplitude order shown here, depending on the desired output power and the load.

Thus, in this example waveform, each of the MIDB blocks are on and outputting a voltage at all times within the cycle. Moreover, the modulated output voltage of the block exemplified by waveform 500 is stepped down in discrete levels (i.e. waveform 500 is an example of a discretely-stepped-down modulated output voltage Vrf).

The modulated voltage from each block may then be outphased to the combiner with the modulated output voltages of remaining ones of the blocks. Outphasing of modulated voltages from the MIDB blocks may be controlled based on the phase information ϕ (or phase angle α) that selectively controls which amplifier blocks are to be turned on or selected. In one embodiment, all the MIDB amplifier blocks may always be turned on. In another embodiment, different combinations (all or less than all) of the MIDB amplifier blocks may be turned on over time for purposes of generating the RF power signal for the load, which may be especially beneficial when the load power requirements change, either expectedly or unexpectedly as a result of information fed back from the one or more sensors 81.

Which MIDB blocks are on or off may be determined by the phase control information output from controller 71 as previously described. In one embodiment, a block-off state may involve controller 71 outputting phase information turning off all power amplifiers in that block. Because the power signal voltages output from selected ones of the MIDB blocks are changed in discrete steps, the overall output of the power signal voltage from the amplifier stage 120 may be changed in discrete steps in order to satisfy the power requirements of the load.

After a step change occurs, the output voltage of power amplifier (or any given block) may settle very quickly, e.g., within a couple of RF cycles. This structure is highly modular, with each block including two or more power amplifiers in order to obtain a predetermined discrete number of voltage levels to be output from each block. This modular configuration may also achieve higher peak power and a broader output power range compared to other proposed designs.

Figure 6:
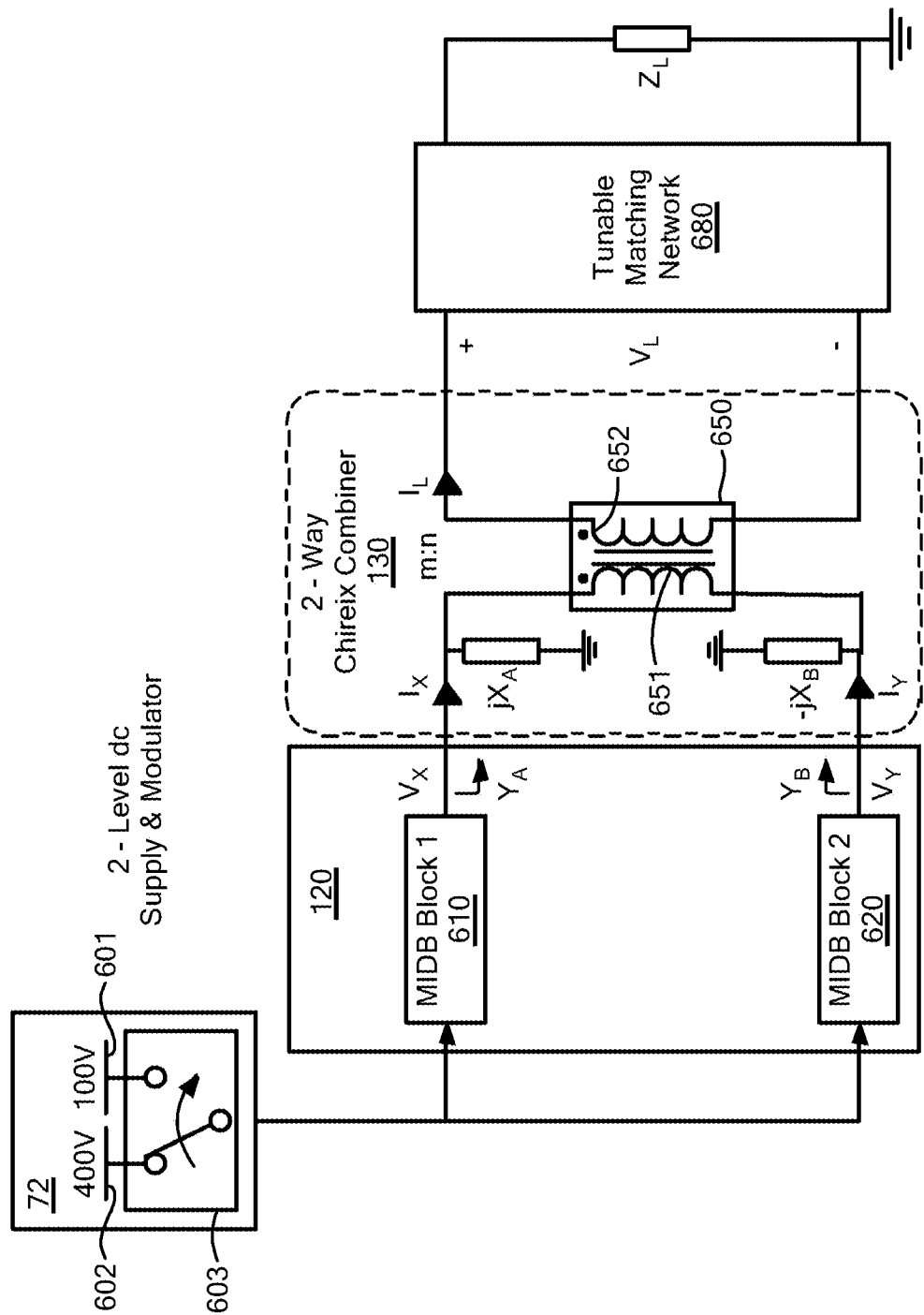
FIG. 6 is a block diagram of an RF power generator with two MIDB power amplifier (PAs).

FIG. 6 shows an embodiment of power combiner 130 in the form of an M-way combiner. The combiner 130 may be a lossless combiner which combines the voltages outphased from the MIDB blocks of amplifier stage 120, e.g., corresponding ones of $V_{RF1}, \ldots, V_{RFM}$ in FIG. 2. For illustrative purposes, the combiner 130 is shown to combine voltages $V_X$ and $V_Y$ output from power amplifier stage 120, which includes two MIDB amplifier blocks 610 and 620. In this case, the power supply 71 includes two power sources 601 and 602 corresponding to 100V and 400V, respectively, which are switched (using switching logic 603) to generate modulated supply voltages for input into the power amplifier 120. In one example implementation, the higher voltage (e.g., 400V) may be derived from a main DC supply and the lower voltage (e.g., 100V) may be derived from an auxiliary supply. In this embodiment, the number of power sources equals the number of MIDB blocks in this non-limiting embodiments. In one embodiment, the numbers of power sources and MIDB blocks may be different.

In the example embodiment of FIG. 6, rf power combiner 130 comprises a Chireix-type combiner having asymmetric compensation. In FIG. 6., the rf combiner is illustrated as a transformer 650 which performs an men voltage and impedance transformation (where in general, m may be greater than or equal to n or m may be less than n). For example, m>n when an upward impedance transformation is needed from the load to the output of the PA blocks based on the construction of the coupled conductors, to generate a combined output voltage $V_L$. The combiner 130 also includes shunt reactive compensation components $jX_A$ and $-jX_B$, which may be provided to adjust the impedance output of the MIDB into a predetermined range. The output current IL of the combiner 130 is based on currents $I_X$ and $I_Y$ output from the MIDB power amplifier blocks 610 and 620, respectively. The output voltage of the combiner $V_L$ (or $V_{RFT}$ in FIG. 1) interfaces with the load $Z_L$ through the impedance transformer 140, one embodiment of which corresponds to box 680.

The load $Z_L$ may be fixed or variable. In a plasma generation application, $Z_L$ may be variable load. In this case, the RF power generator may change the level of the output voltage in order to satisfy the varying power requirements of the load. This may be accomplished, at least in part, by selectively activating the MIDB power amplifier blocks.

The impedance transformer 140 (see FIG. 1) adjusts the impedance of the RF power generator to match the load. In one embodiment, the impedance transformer transforms the output impedance of the RF power generator to a predetermined impedance (or range of impedances) that match the impedance of a variable RF load $Z_L$, at least to within a predetermined tolerance. Performing impedance matching in this manner may increase efficiency and reduce the over-rating of the power amplifier hardware in order to accommodate the load range.

More specifically, the switched-mode MIDB blocks may have varying impedances based on which combination of individual power amplifiers are selected. The impedance transformer 140 may map the output impedance of the amplifier stage 120 to match the impedance of the load. In one embodiment, the impedance transformer 140 may allow the RF power generator to directly interface with the variable load (e.g., a plasma chamber), thereby alleviating the need for an external system that impedance-matches the load to a certain intermediate impedance value, e.g., 50Ω. Also, by including the impedance transformer in the RF power generator, the impedance transformer may perform less extreme impedance compressions, yielding a narrowed range of load impedance that can be acceptably presented to the power amplifiers.

The impedance transformer 580 may be implemented in a variety of ways. In one embodiment, the impedance matcher may include a tunable matching network using one or more of (a) phase-switched impedance modulation, (b) switched capacitors, (c) dynamic frequency tuning, and/or (d) a resistance compression network. An embodiment of a tunable matching network (TMN) 580 (see FIG. 6) may have all or a portion of the following features:

a fixed impedance transformation ratio, where the load impedance range is scaled by a certain transformation ratio k.

a fixed matching network where passive components of fixed values are used to provide some load transformation, and in some cases also some degree of compression if frequency is varied in a predetermined (e.g., relatively small) range.

a matching network with discrete-switching passive components, where several binary-valued components are optionally connected into the system through switches to provide a range of discrete matching reactances.

dynamic frequency tuning (DFT), where the frequency is dynamically varied within a predetermined (e.g., relatively small) extent and combined with passive components (e.g. a high-Q resonant tank) to provide a range of continuously-tunable matching reactances.

phase-switched impedance modulation (PSIM), which, for example, may be performed by controlling the duration of time a fixed capacitor is connected to the system at each RF cycle. This technique may obtain a range of continuously-tunable matching reactances at a predetermined fundamental frequency.

one or more resistance compression networks (RCN), which may be especially suitable for situations where a pair of (or multiple) loads with close variation patterns are present. This technique may then compress the range of real impedance variations of the two (or multiple) loads through a passive network, each individually or together as a combination.

As discussed, one example of a variable load is a plasma generator that is used for semiconductor processing applications. Plasma generators have wide load impedance ranges. The TMN 580 or other implementations of impedance transformer 140 may perform adjustments, or a remapping, to match varying load impedances in order to ensure acceptable operation for the switched-mode power amplifiers.

Figure 7:
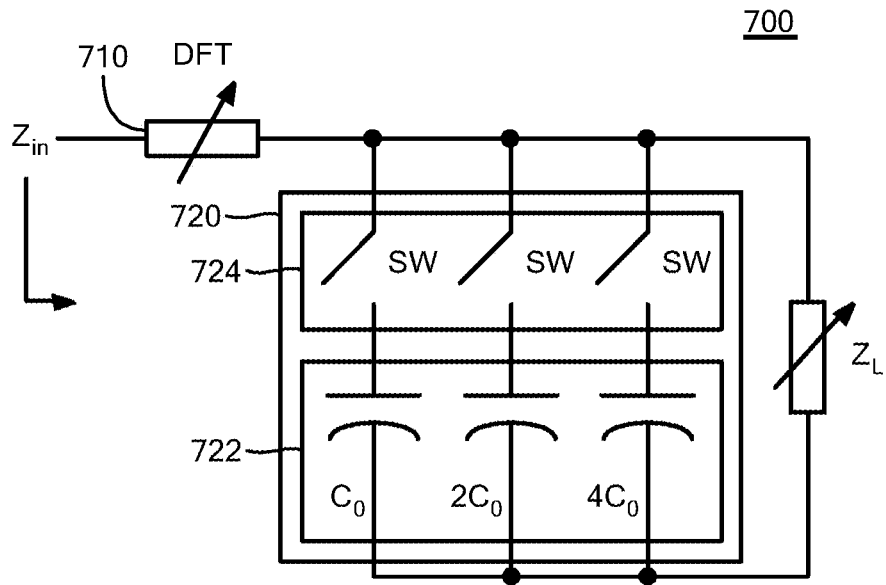
FIG. 7 is a schematic diagram of an example embodiment of an impedance transformer.

FIG. 7 shows an embodiment of a tunable matching network 900 which may be used to implement the impedance transformer 680 in FIG. 6 or 30 in FIG. 1. The tunable matching network may operate to provide a dynamically adjustable impedance matching between the output of the power combiner and the load. This may include providing a dynamically variable voltage transformation and reactive impedance adjustment. and may include a dynamic frequency tuner (DFT) 710 coupled to the input of a discrete-switching passive network 720. In one embodiment, the tunable matching network may operate in-conjunction with the power combiner, which provides an additional impedance transformation ratio, for example, a fixed ratio based on the turns-ratio of the transmission-line-based power combiner.

The output impedance seen by the MIDB blocks may correspond to the matched load impedance, scaled, for example, by the squared turns ratio of the combiner $(m/n)^2$. Depending on the power amplifier architecture, the ratio may be set so that the power amplifiers operate in a predetermined range, e.g., near their optimal load impedance range so that efficiency is optimized.

The DFT 710 may receive the output of the power combiner 130 and generate a continuously varied series reactance. The DFT unit may be implemented, for example, with a high-Q series inductor (L) and capacitor (C), tuned to resonate at the center of the operating frequency. Thus, at the center operating frequency (and ideally, at exactly the center operating frequency), the DFT tank presents approximately zero impedance (and ideally, zero impedance). However, with a continuously-controlled frequency variation above and/or below the center frequency (and in at least some embodiments, a small, continuously-controlled frequency variation above and/or below the center frequency), the DFT tank may correspondingly present a series reactance, which can be inductive and/or capacitive, that serves as part of the impedance transformation network in matching the load impedance $Z_L$ to the desired impedance $Z_{in}$. The discrete-switching passive network 720 includes a plurality of capacitors 722 coupled, in parallel, between the DFT 710 and the load ZL through switches 724. In one example implementation, the capacitors 722 may be binarized capacitors that are selectively switched to provide shunt reactances. Switching different combinations of the capacitors allow the shut reactances to be varied in discrete steps based on the capacitance values. In this embodiment, three capacitors are shown with progressively greater predetermined capacitances $C_0$, $2\,C_0$, and $4\,C_0$. A different number of capacitors and/or capacitors with a different progression of capacitances may be used in another embodiment.

The switches 724 may be selectively opened to vary the applied shunt reactances in discrete steps, as stated. The switches may be selectively opened and closed in different combinations, for example, based on switching signals from the controller 71. In operation, small frequency variations corresponding to a selected discreate step applied on top of the series reactance from the DFT 710 may allow for generation of continuously controlled series reactances to meet the changing conditions of the load. Thus, when combined with the series reactances output from the DFT 710, the tunable matching network 680 achieves an impedance transformation that matches the impedance of the variable load, at least to within a predetermined tolerance or range. Moreover, through this design, the tunable matching network 680 is able to compress load variations into an impedance range so that efficiency of the power amplifiers is not adversely affected, while at the same time maintaining low overall system complexity. It will be appreciated that other tunable matching network designs may be likewise used, including based on varactors, phase-switched impedance modulation, and other techniques.

Figure 8:
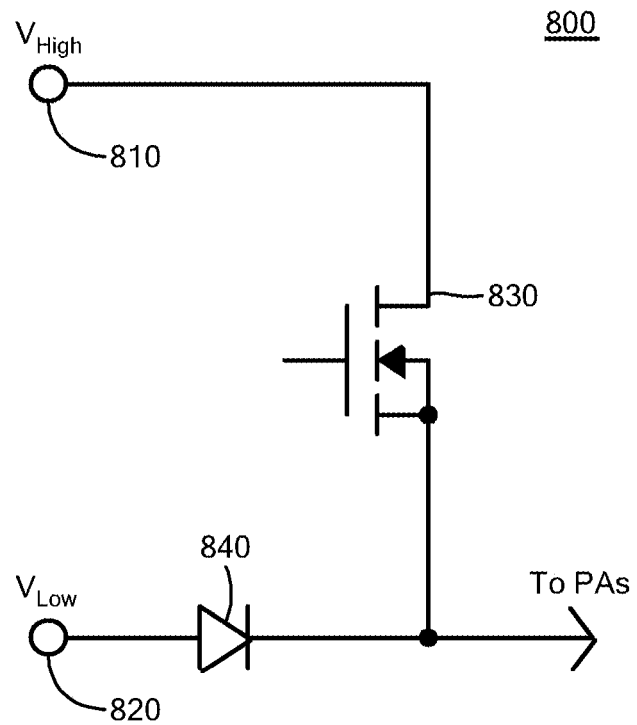
FIG. 8 is a schematic diagram of an example embodiment of a discrete drain modulation circuit for a PA.

FIG. 8 shows an embodiment of a modulator 800, which may correspond to one example of switching logic 603 (see FIG. 6) and which may be used to perform the discrete drain modulation in power supply 72. Discrete drain modulation may extend the achievable output power range of the RF power generator. It may also reduce voltage-related losses (e.g., transistor cross-related losses, ZVS resonance losses, etc.) of the power amplifiers, which may become dominant at lower power levels.

Referring to FIG. 8, the modulator 800 is designed as a two-level supply modulator which receives a first supply voltage $V_{High}$ through a first input 810 and a second supply voltage $V_{Low}$ through a second input 820. The supply voltages may be derived from different types of sources or the same type of source. In one embodiment, the supply voltages may come from power supplies of different power ratings, e.g., the higher voltage $V_{High}$ may come from a main supply rated for peak-to-mid power ranges and the lower voltage $V_{Low}$ may come from an auxiliary supply rated for low power levels only. In plasma generation application, the second supply voltage $V_{Low}$ may have a value at or just above the lowest voltage level before the semiconductor device capacitance nonlinearity adversely affects power amplifier performance, e.g., a loss of zero-voltage switching (ZVS).

Both supply voltages are coupled to different inputs of a transistor 830, which, for example, may be an N-channel transistor. The first supply voltage $V_{High}$ may be input into the drain of the transistor, and the second supply voltage $V_{Low}$ is coupled to the source of the transistor through a blocking diode 840. The gate of the transistor may be coupled to receive a control signal to control switching of the transistor, e.g., the control signal may be CS generated by controller 71 as shown in FIG. 1.

In one embodiment, it may be assumed that $V_{High}$ and $V_{Low}$ are continuously being received, and that $V_{Low}$ is greater than the forward bias voltage of the blocking diode 840. When a gate signal is input to turn transistor 830 on, the first supply voltage $V_{High}$ passes through the transistor and node $N_{out}$ (that is, in this example embodiment, the voltage $V_{Low}$ is blocked by blocking diode 840, so that the voltage output from node $N_{out}$ is $V_{High}$). The combined voltage is then sent to one or more selected MIDB power amplifier blocks of amplifier stage 120 (e.g., in FIG. 2). When a gate signal is not received by the transistor 830, the diode conducts and the second supply voltage $V_{Low}$ is output to the power amplifier at output node $N_{out}$. The blocking diode 840 serves to block input of the first supply voltage into the input terminal 820 when the transistor is turned on. Thus, modulator 800 generates (or modulates between) two discrete levels of voltages (e.g., two discrete DC voltage levels $V_{Low}$ or $V_{High}$) for input into the MIDB blocks of the power amplifier.

While modulator 800 may be beneficial for some applications, in other applications more than two levels of supply voltage may be beneficial. Thus, in one embodiment the modulator of the power supply 72 may output more than two levels of voltages. For efficiency purposes, the number of discrete voltages output from the power supply 72 may vary among embodiments to achieve a desired power range, response speed, and/or efficiency.

Figure 9A:
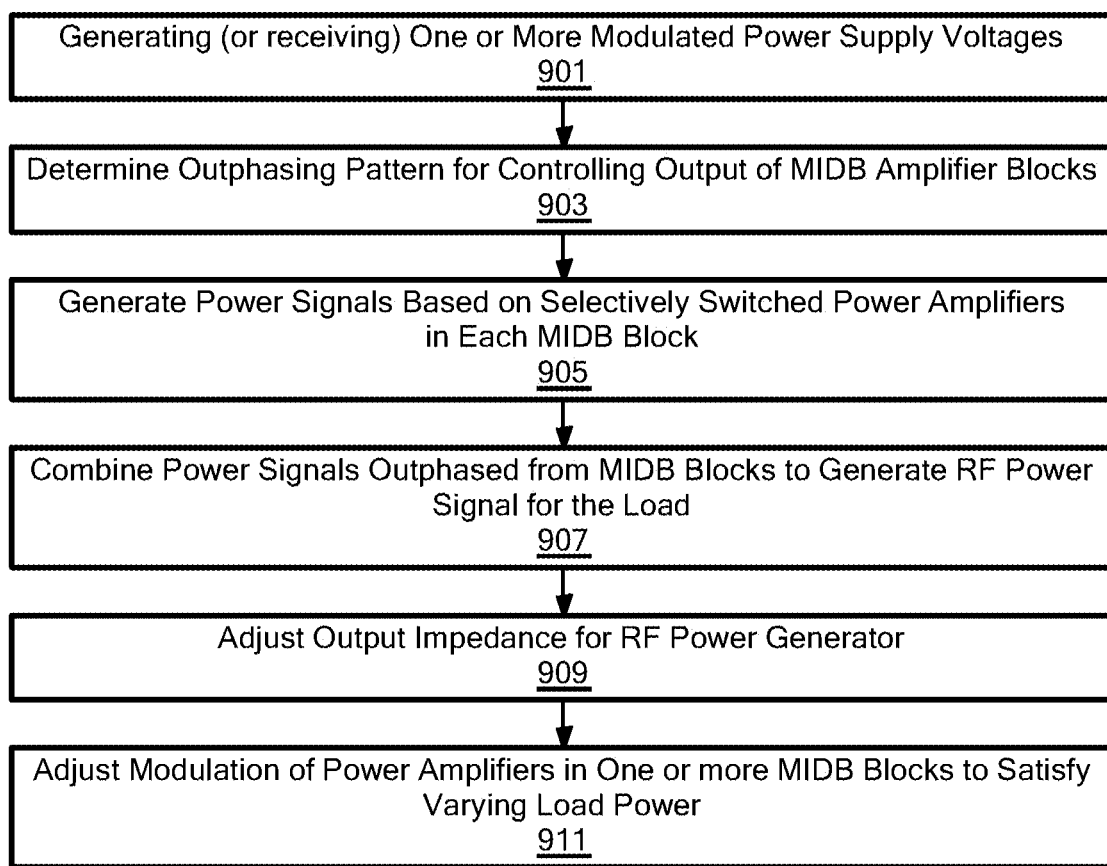
FIGS. 9A-9C are a series of flow diagrams illustrating a method for generating an RF power signal.

FIG. 9A illustrates an embodiment of a method for generating RF power for a load, which, for example, may be a plasma generator or another type of load. The method may be performed based on one or more embodiments of the RF power generator described herein.

Referring to FIG. 9A, at 901, the method initially includes generating (or receiving) one or more modulated power supply voltages for output to the amplifier stage 10. The same modulated power supply voltage may be output to all of the amplifier blocks in the amplifier stage at the same or different times, or different modulated power supply voltages may be output to the amplifier blocks at the same or different times. The modulation may be discrete drain modulation of the voltages provided by one or more power sources. Which sources are selected and the modulation to be performed may be based on one or more control signals output, for example, from controller 71. The control signals may correspond to a predetermined pattern or scheme and/or may be adaptively generated, for example, based on feedback from one or more sensors 81 (e.g., see FIG. 1).

At 903, an outphasing pattern is determined, for example, by controller. The outphasing pattern may correspond to prestored control information stored in a non-transitory computer-readable medium (e.g., memory) 75. The prestored control information may be, for example, in the form of instructions or other forms of firmware or software. The prestored control information may control operation of the MIDB blocks for purposes of generating the RF power signal to the load. The outphasing pattern, and/or other control information embodied within the control information (e.g., instructions) for the controller 71, may determine the discrete modulation that is to be performed for the power amplifiers in each of the MIDB amplifier blocks.

At 905, each of the MIDB blocks are controlled to generate respective power signals based on the outphasing and/or other control information from the controller. When all of the MIDB blocks are always on, the discrete modulation of the power signals outphased from all of the MIDB amplifier blocks are used to generate the RF power signal for the load. In this case, the amplifier blocks are not switched (or selected) and the power amplifiers in each block are switched, e.g., according to a symmetrical or asymmetrical sequence. When the MIDB amplifier blocks are to be switched along with the power amplifiers in each block, the discrete modulation of the power signals outphased from the blocks are used to generate the RF power signal for the load. In order to perform the switching for discrete modulation, some of the power amplifiers in one or more of the blocks must be deactivated in accordance with the outphasing pattern. This may be accomplished, for example, AC grounding.

At 907, power signals output from the power amplifier blocks are combined to form an RF power signal for the load. Combining the power signals may be performed in various ways, e.g., with or without weights, using a Chireix combiner, etc. As previously described, the discrete modulation performed in the amplifier blocks may cause discrete steps in the RF power signal to meet the varying power requirements of the load.

At 909, the output impedance of the RF power generator is adjusted to match the impedance of the load, at least to within a predetermined tolerance. The adjustment may be performed by the tunable matching network or any of the other types of impedance transformers described herein.

At 911, over time, the power requirements and/or impedance of the load may change and/or changes in the RF power generator may be required. Proportional changes to the RF output power and/or impedance are performed to satisfy the changing power requirements of the load and to match any changes in load impedance. This may be accomplished by selecting different combinations of MIDB blocks, and/or different power amplifiers in the selected MIDB blocks, to effect changes (e.g., discrete steps) in voltage of the output RF power signal 70. The selections may be performed, for example, by changing the on/off states of corresponding ones of the power amplifiers (PAs) based on control signals from the controller 71.

Figure 9B:
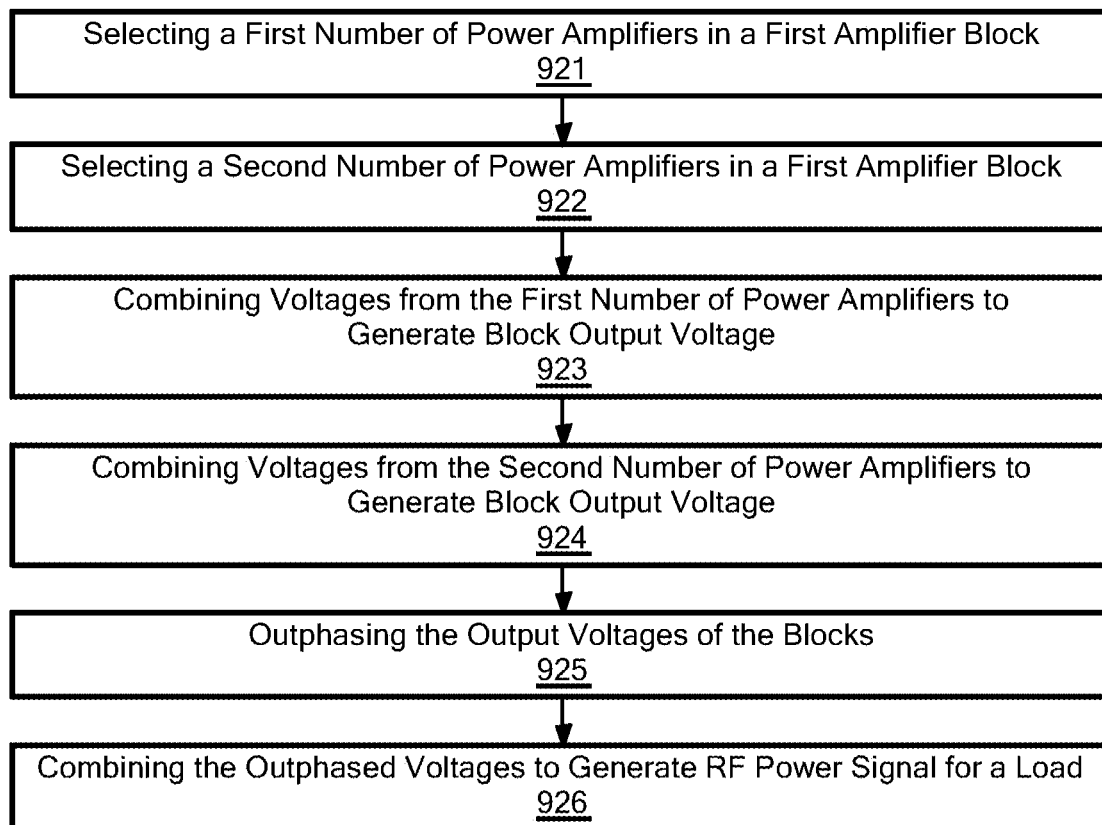

FIG. 9B shows an embodiment of a method for generating RF power for a load, which, for example, may be performed by one or more of the RF power generator embodiments disclosed herein. Referring to FIG. 9B, the method includes selecting a first number of power amplifiers in a first amplifier block (921), selecting a second number of power amplifiers in at least a second amplifier block (922), combining voltages from the first number of power amplifiers to generate an output voltage of the first amplifier block (923), combining voltages from the second number of power amplifiers to generate an output voltage of the second amplifier block (924), outphasing the output voltages of the first and second amplifier blocks (925), and combining the outphased voltages to generate an RF power signal for a load (926). Like with other embodiments, this method may be supplemented with an operation of selecting different ones of the amplifier blocks. Otherwise, the amplifier blocks may be fixed to be continuously on.

Figure 9C:
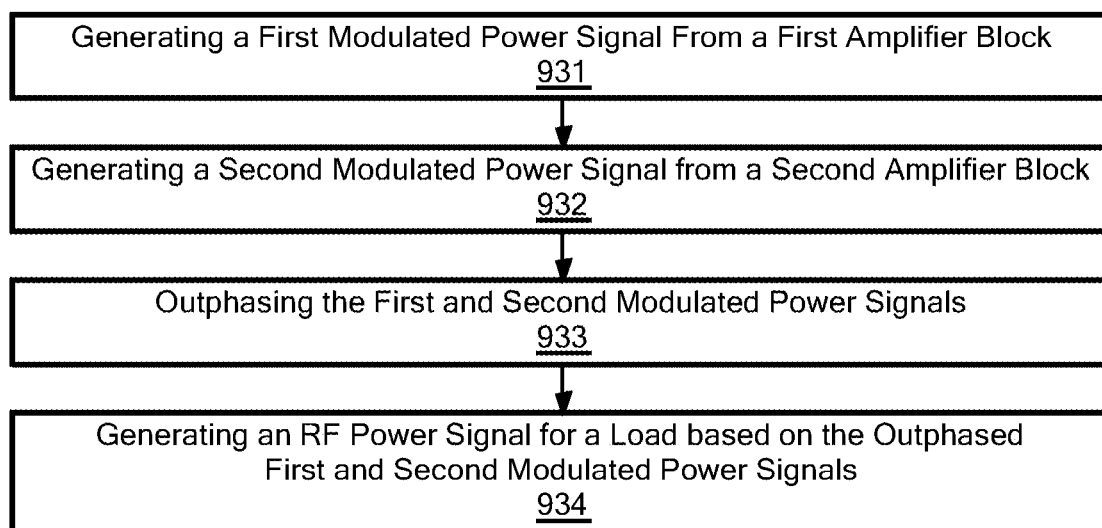

FIG. 9C shows an embodiment of a method for generating an RF power for a load which, for example, may be performed by one or more of the RF power generator embodiments disclosed herein. Referring to FIG. 9C, the method includes generating a first modulated power signal from a first amplifier block (931), generating a second modulated power signal from at least a second amplifier block (932), outphasing the first and second modulated power signals based on a phase angle (933), and generating an RF power signal for a load based on the outphased first and second modulated power signals (934). Generating the first modulated power signal may include switching one or more of a plurality of power amplifiers in the first amplifier block, and generating the second modulated power signal may include switching one or more of a plurality of power amplifiers in the second amplifier block.

Power Control Management Example

One of the many applications of the RF power generator embodiments described herein is to power a plasma generator in a semiconductor manufacturing process. The plasma generator may require a very wide output power modulation range compared to other applications. The RF power generator embodiments may achieve this range by implementing broad, discrete steps in RF output voltage using discrete drain modulation and on/off control of MIDB power amplifier blocks, coupled with fine, continuous tuning of RF output voltage (with outphasing between MIDB blocks). A non-limiting embodiment of such a power control management approach is described below.

Figure 10:
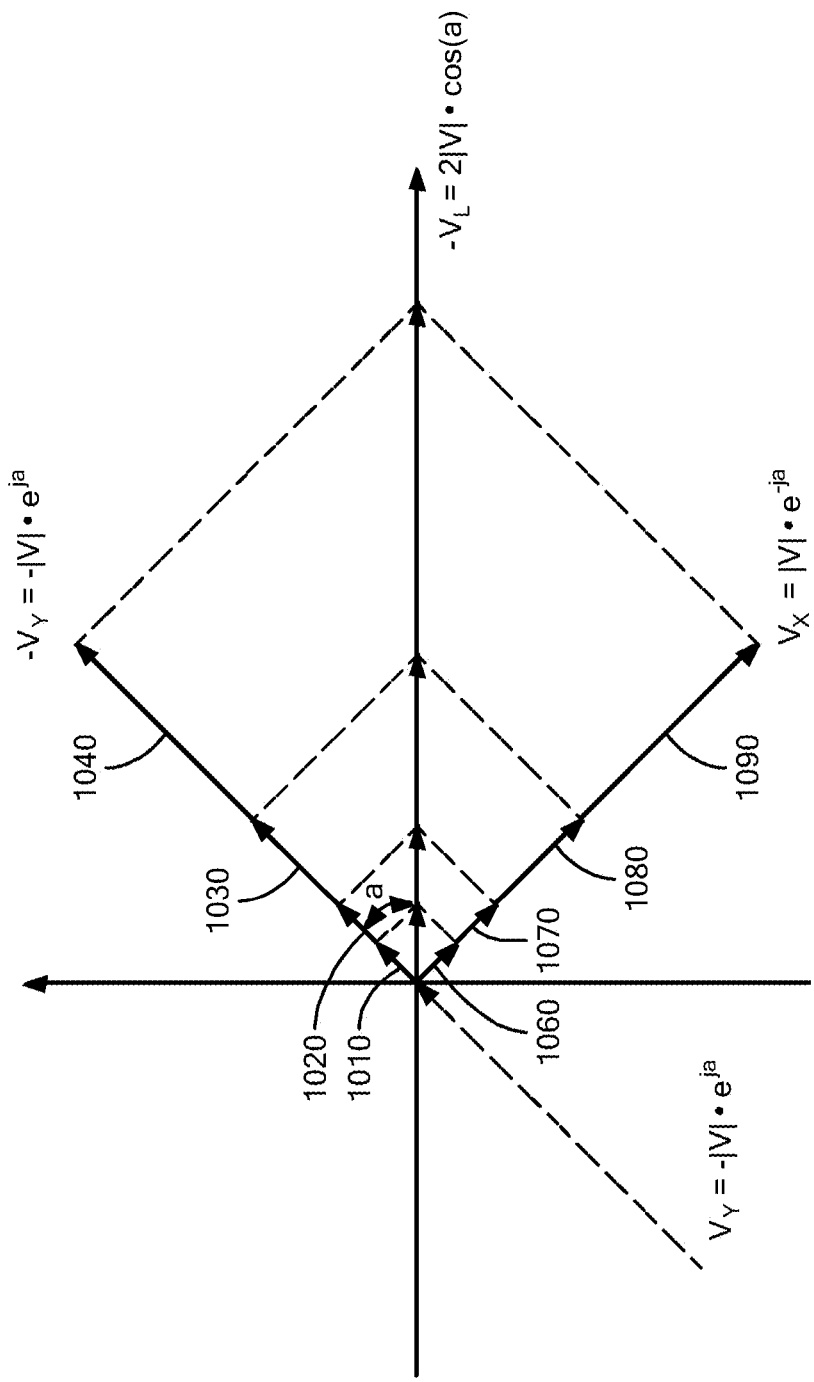
FIG. 10 is a plot (a voltage vector graph) of MIDB block output voltage vs. load voltage.

FIG. 10 shows illustrates an example of a voltage vector graph of a power management control method of the RF power generator. This example corresponds to the embodiment of the RF power generator of FIG. 6, having two MIDB phase amplifier blocks.

Referring to FIG. 10, the RF voltage output from the first MIDB block 510 corresponds to voltage VX and the RF voltage output from the second MIDB block 520 corresponds to voltage VY. These voltages may be given by the following equations:

$$V_Y = -|V| \cdot e^{j\omega}$$
$$-V_Y = |V| \cdot e^{j\omega}$$
$$V_X = -|V| \cdot e^{-j\omega}$$
$$V_L = 2|V| \cdot \cos(\alpha)$$

As shown from these equations, the load voltage (VL) at the output of the combiner 230, and thus the power output from the RF power generator, is controlled through both the outphasing angle and the magnitude of the MIDB block output voltage. The outphasing angle ($\alpha$) is based on the phase shift between the two RF voltages output from the MIDB blocks.

The magnitude of the output voltage(s) of selected ones of the MIDB blocks (in this example is voltage |V|) is obtained by drain modulation and on/off control of the power amplifiers in respective to ones of the blocks. With the 2-level power supply modulation and MIDB-block configuration of FIG. 6, two groups of four non-zero voltage magnitudes are available at the same outphasing angle ($\alpha$). The first group corresponds to vectors 1010, 1020, 1030 and 1040, and the second group of vectors corresponds to vectors 1060, 1090, 1080, and 1090.

More specifically, the magnitude of the load voltage (VL) directly correlates to the output power (e.g., which is directly proportional to $|V_L|^2$) and can be modulated through the combined effects of outphasing and discrete drain/MIDB modulation. Outphasing provides continuous control as the phase shift can be continuously varied, in one embodiment subject only to the resolution of implementation hardware. The discrete voltage modulations (e.g., achieved by switching to a different supply rail or MIDB on/off configuration may cover a very wide output power range (e.g., (e.g. 1000:1 or 30 dB) and may be invoked, for example, when the RF power generator can achieve higher efficiency at a different voltage domain or undergoes large power variations.

The discrete voltage steps at the output of MIDB blocks may be achieved based on a combination of supply modulation and MIDB control. For example, with the 2-level supply voltages of FIG. 8 set to Vhigh=V and $$Vlow = \frac{V}{3}$$

and a 2 MIDB power amplifier block configuration, the available voltage levels may be output from the power amplifier 120 shown below. Here, PA refers to an individual power amplifier in the MIDB blocks. Using this power management method, a single outphasing power range may be obtained (e.g., by scaling according to squared voltage ratios) to cover a very wide power range while simultaneously maintaining high efficiency.

| Voltage | Condition |
|---|---|
| V | Both MIDB blocks selected (active) Power Supply modulated to $V_{High}$ |
| $\frac{V}{2}$ | One PA selected (active) and the other PA grounded (inactive) per block and power supply modulated to $V_{High}$ |
| $\frac{V}{3}$ | Both MIDB blocks selected (active) Power Supply modulated to $V_{Low}$ |
| $\frac{V}{6}$ | One PA selected (active) and the other PA grounded (inactive) per block and power supply modulated to $V_{Low}$ |

Figure 11:
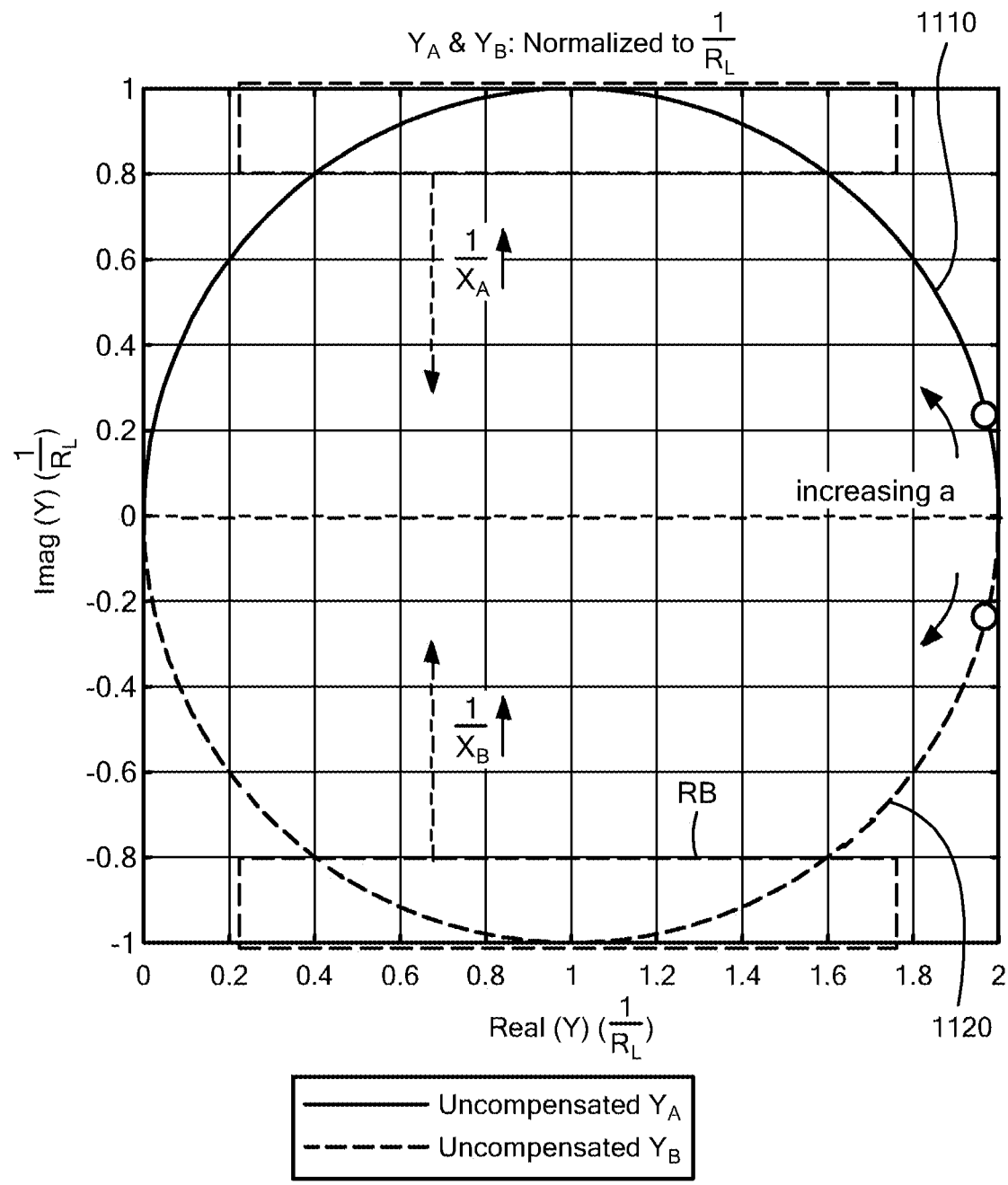
FIG. 11 is a plot of uncompensated load admittance curves seen by MIDB blocks ($Y_A$ and $Y_B$ in FIG. 6) as an example of admittance for assessing performance and power management.

FIG. 11 shows a graph of admittance values that may be used for determining performance and performing power management and control features in accordance with one or more embodiments. This graph may be beneficial for assessing load modulation effects on the power amplifiers in the MIDB blocks during outphasing and corresponding compensation component design and outphasing angle selection. For example purposes, the graph of FIG. 11 may correspond to two-MIDB block phase amplifier of FIG. 6, but may be extrapolated to embodiments with more than two MIDB blocks.

Referring to FIG. 11, uncompensated load admittance for MIDB block 610 in FIG. 6 is shown by the upper semicircular curve 1110 and uncompensated load admittance for MIDB block 520 is shown by the lower semicircular curve 1120 during outphasing (e.g., see also YA and YB in FIG. 6). The uncompensated load admittance (YA) for MIDB block 610 and the uncompensated load admittance for MIDB block 620 (YB) may be expressed as follows:

$$Y_A = \frac{1}{R_L}\left[1 + e^{j2\alpha} - j\frac{1}{X_A}\right]$$

$$Y_B = \frac{1}{R_L}\left[1 + e^{-j2\alpha} + j\frac{1}{X_B}\right]$$

The axes are normalized to $1/R_L$, based on the assumption that the tunable matching network 680 and the combiner 130 match the load to a pure resistive effective impedance RL. Each MIDB block has a load admittance point on its corresponding curve determined by the outphasing angle and compensation component selection. With a fixed MIDB output voltage magnitude, the output power is proportional to the real part of the load admittance, e.g., the larger of Re{$Y_A$ or $Y_B$}, the higher the output power.

For the power amplifiers (PAS), the closer the load is to the real axis (dashed line in FIG. 11), the more efficiently the PA operates. However, it can be seen from the graph that when the output power is varied by changing the outphasing angle, both the conductance and susceptance load seen by the MIDB block (and hence by the PAs) would change, affecting the system efficiency during the process. Thus, in some cases outphasing alone may have a limited range of power modulation for efficient operation. In some cases, compensation reactances may be selected to shift the curves so that the admittances stay close to the real axis for as wide power modulation range as possible, e.g. values such that the portion of admittance curves encircled by box RB in FIG. 11 is close to the real axis.

The load admittance characteristics may be independent of voltage, in order to ensure power control continuity over voltage steps. In some applications, a certain minimum span may exist for the outphasing angle range. In one embodiment, for all MIDB-block modulated voltage levels (n/n, n−1/n, . . . , 2/n, n1/n for MIDB block n), the largest voltage step may be predetermined (e.g., 2:1). Therefore, in one non-limiting example, the admittance range may span at least [0.4/$R_L$ to 1.6/$R_L$] (e.g., the phase angle ($\alpha$) range [26.57°, 63.43°]) may be a subset of the modulation range.

In some embodiments, for a given output power profile, efficiency optimizations of the RF power generator may be possible in terms of an optimal number of power amplifiers per MIDB block, the supply voltage level, the device area, compensation reactances, and/or the target load impedance of the template matching combiner (e.g., 680 in FIG. 6).

In terms of dynamic response, the control method may satisfy a commanded step change of output power in three ways: (1) a change in outphasing angle, (2) a change in MIDB on/off configuration, and (3) a change in discrete supply modulation. Changing the outphasing angle may perform a step change in the effective load impedance seen by the power amplifiers in each MIDB block. Changing the MIDB on/off configuration and changing the discrete supply modulation may perform a step change in the common-mode voltage across the dc-blocking components of one or more of the block power amplifiers. By distributing resonant tanks to each of the block power amplifiers, the RF power generator may achieve a very fast settling time in all three scenarios by reducing or minimizing the dc-blocking capacitor value. This may also have the added benefit of fully modularizing at least the power amplifier 120 of the RF power generator, where the MIDB blocks can be easily re-configured to meet the new specifications of the intended application.

Example Simulation Results

To evaluate performance of a simulated version of the RF power generator, an example circuit model was implemented in LTSpice for the 2-level, MIDB-2 configured power generator of FIG. 6 implemented with ZVS Class-D amplifiers in each MIDB block and lossless outphasing combiners in the power amplifier 220. The power generator was configured for an output power profile corresponding to a real-world plasma loading application having the following parameters: 0.2 kW for 1 ms, 1 kW for 1 ms, and then 5 kW for 20 µs). Also, GaN FET PGA26E19BA switches were specified at an ISM band frequency 13.56 MHz. The tunable matching network 580 was assumed to match the variable plasma load to a fixed real impedance RL. The following simulation results were obtained.

Efficiency and Power Range Simulation Results. For efficiency plots, peak dV/dt loss fitting for Coss loss calculation was adopted, and a 5.5× scalar on nominal Rds,on for devices in active block PAs, and a 2× scalar for the conducting switch when a PA was turned on was applied. Additionally, a quality factor (Q) of 500 was set for the inductors and ideal common-mode combiners, and the supply voltage levels were at 300V and 100V based on the switch loss characteristics and power range considerations. To account for modulator losses (e.g., loss across diode 740 in FIG. 7), a 99% scalar was applied to the lower supply voltage case. Some key system design parameters are listed in the following table.

| Device | PGA26E19BA | $R_L$ (Ω) | 11.25 |
|---|---|---|---|
| PA Units per MIDB Block | 2 | $X_A$ (jΩ) | 11.81 |
| PA Circuitry | ZVS Class-D | $X_B$ (jΩ) | −12.5 |
| Peak Power (W) | 5000 | Power Range | 1000:1 |
| Elliciency at Peak Power (%) | 90.2 | Average Power Efficiency (%) | 91.7 |

Figure 12:
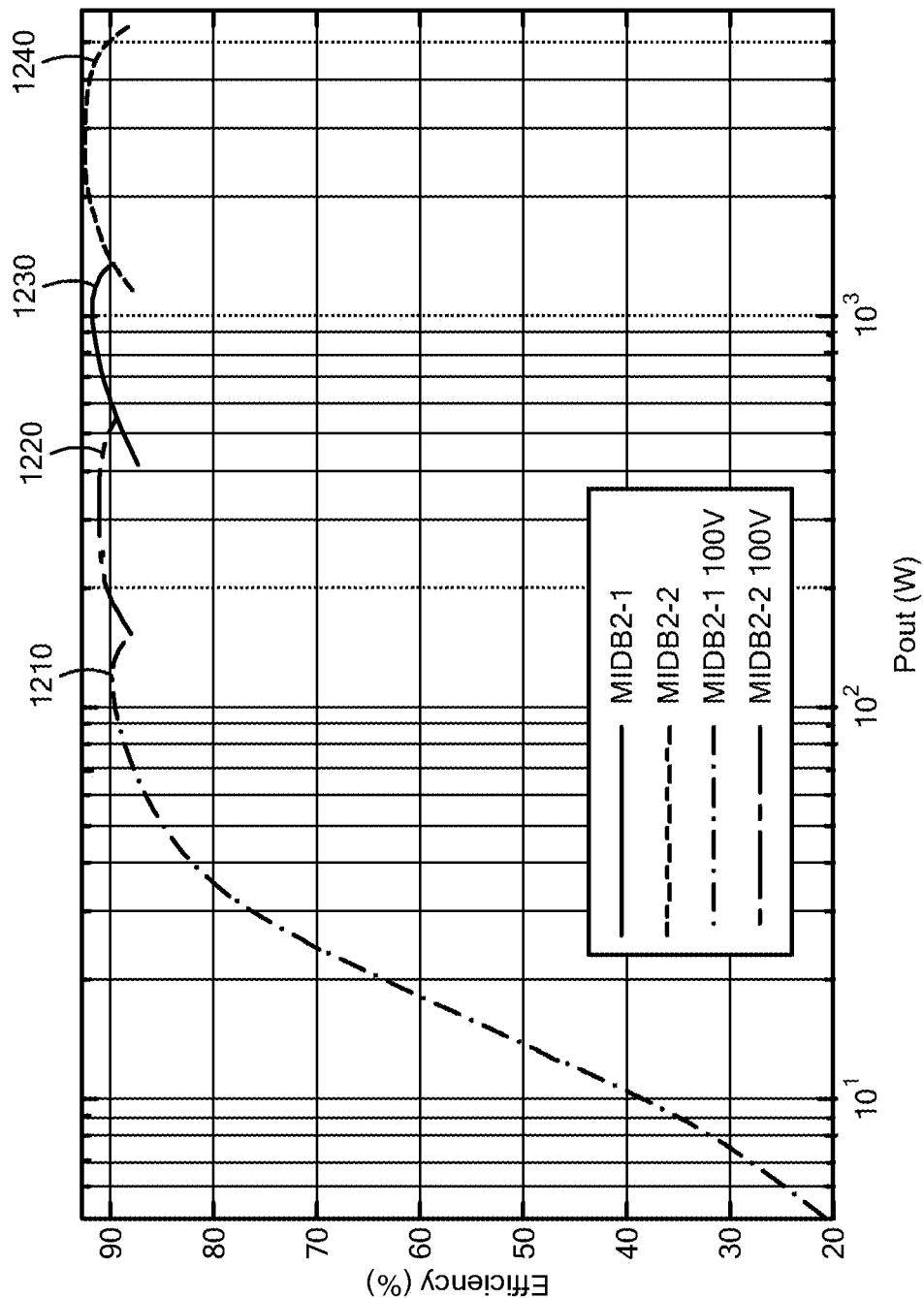
FIG. 12 is a plot of efficiency vs. output power for embodiments of MIDB systems.

FIG. 12 shows the efficiency versus output power backoff curves for the simulated RF power generator using MIDB power amplifier blocks, outphasing, and a Chireix combiner. The main dc supply voltage level was 300V, rated for 5 kW peak power and the auxiliary supply voltage level was 100V rated for less than 500 W peak power. The output power was modulated with outphasing for each continuous segment 1210, 1220, 1230, and 1240, and discrete RF voltage modulation was used (by MIDB on/off control and/or supply modulation) at the intersections to maintain high efficiency for wide power range.

Moreover, in FIG. 12, the vertical lines mark power levels in the load profile. As it can be seen, a high efficiency above 90% was achieved throughout the power ranges (200 W to 5 kW), and at least 30 dB in output power range (5 W to 5 kW) was achieved. Though rated for multi-kW peak power, the power generator can reliably deliver power at a very low power of 5W, with efficiency of >20% at the lowest designed power level.

Figure 13:
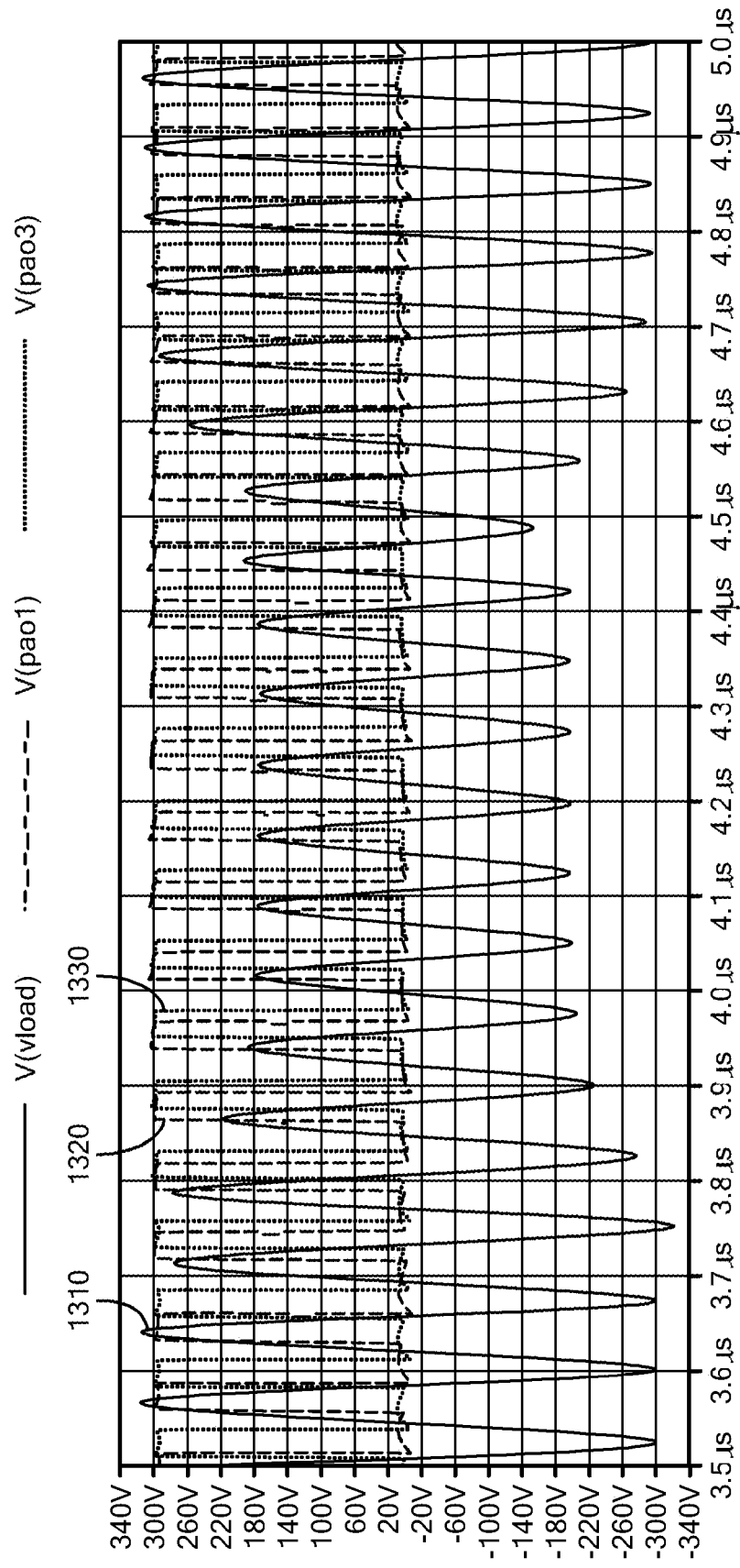
FIG. 13 is a plot of voltage vs. time illustrating dynamic response to a step in outphasing angle.

FIG. 13 shows the dynamic response of the output voltage of power amplifiers to outphasing. The waveforms in FIG. 13 show very fast dynamic behavior was achieved, setting at new commanded voltage levels without a couple of RF cycles. In particular, waveform 1310 corresponds to VLoad voltage and indicates the output voltage of a 1:1 turns ratio Chireix combiner (e.g., VL in FIG. 5). Waveforms 1320 and 1330 correspond to VPAO1 and VPAO3 and indicates the unfiltered switching mode voltage of two power amplifiers, each in different MIDB blocks. In this simulation, the phase angle α was stepped from 30° to 60° at time=3.69 μs and reverted back to 30° at time=4.42 μs, e.g., only after 10 RF cycles.

Figure 14:
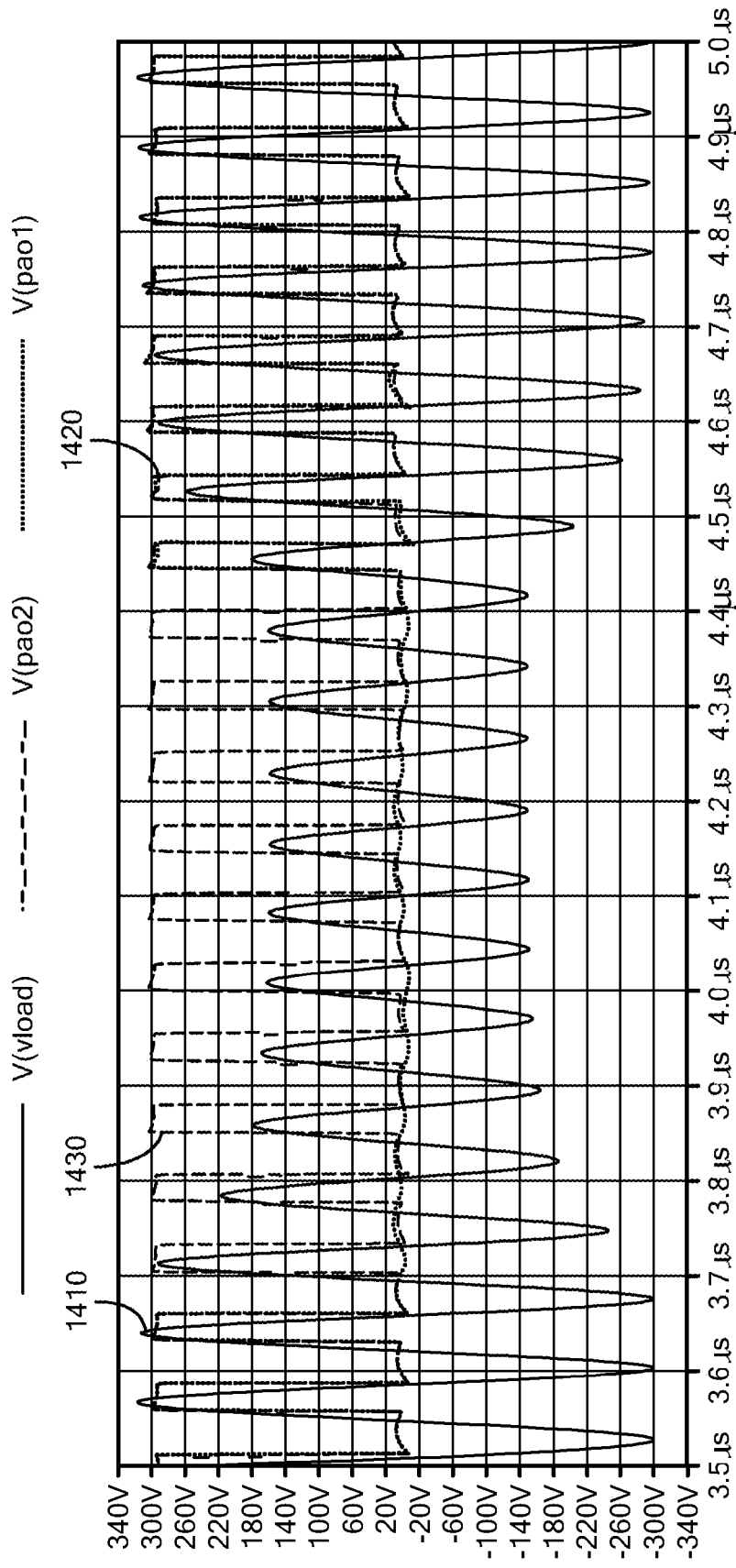
FIG. 14 is a plot of voltage vs. time illustrating dynamic response to a step in MIDB configuration.

FIG. 14 shows an example where the dynamic response of the output voltage of the MIDB power amplifier was very fast. In FIG. 14, waveform 1410 corresponds to the output voltage of the 1:1 turns ratio Chireix combiner (VL in FIG. 6). The waveform 1420 for VPAO2 and the waveform 1330 for VPAO1 represent the switching mode voltages of respective ones of two PAs in the same MIDB block. One PA is turned off (e.g., AC grounded) at time=3.69 μs and is turned back on (e.g., switching) at time=4:42 μs.

Figure 15:
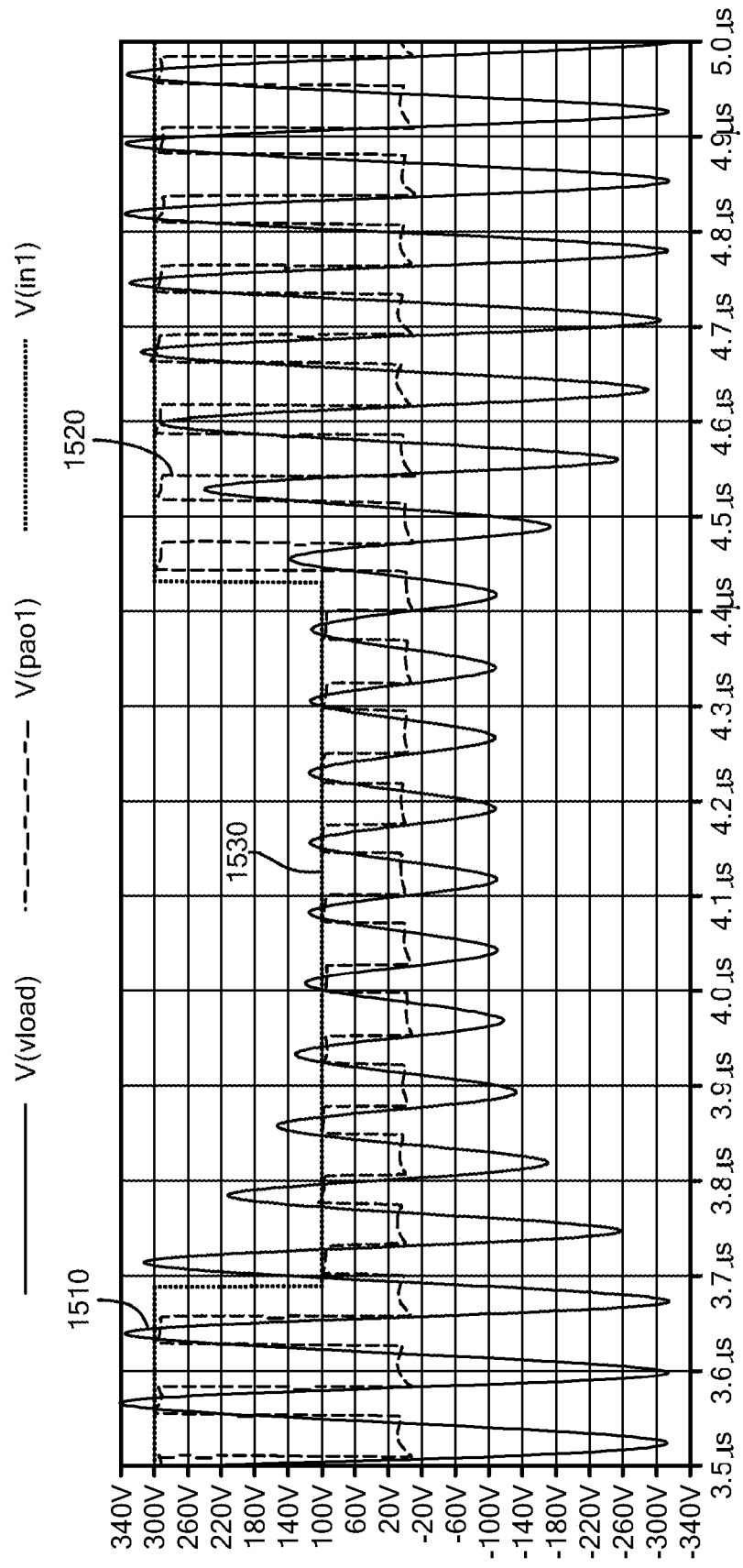
FIG. 15 is a plot of voltage vs. time showing example performance metrics for one or more embodiments.

FIG. 15 shows an example of the dynamic step response of the output voltage to discrete supply modulation, and that a fast settling at a microsecond-level can be achieved. For example, the dynamic response to a step in supply voltage (e.g., performed by the modulator in the power supply 72) is expressed in the following waveforms. Waveform 1510 corresponds to the output voltage of the 1:1 turns ratio Chireix combiner (corresponding to Vvload in FIG. 15 and VL in FIG. 6). Waveform 1520 (marked V(in1)) corresponds to the supply voltage of the power amplifier in a selected MIDB block, and Waveform 1530 corresponds to the switching node voltage of that power amplifier. The supply voltage reduced from 300V to 100V at time=3.69 μs and reverted back to 300V at time=4:42 μs.

In accordance with one or more embodiments, an RF power generator is provided with a unique system architecture and power control methodology. In some implementations, the RF power generator may have various combinations of the following features: (1) outphasing of power signals for fast-response (and, if desired, continuous) power generation, (2) discrete power voltage modulation using switched-mode (e.g., on/off control) power amplifiers in MIDB blocks, and/or (3) discrete drain modulation of supply voltages to expand a high-efficiency operating power range of a load in a variety of applications. In one embodiment, the load may be a plasma generator used during a semiconductor chip fabrication process. In other embodiments, the load may be different and may operate in a different (higher or lower) power range, e.g., one that does not have the high-power range and performance demands of a plasma generator.

The discrete drain modulation may be performed in various ways. In a power generator having two MIDB blocks, for example, two power supply sources may be used, e.g., a main DC power source (e.g., for peak-to-mid power levels) and an auxiliary DC power source (e.g., for lower power levels). Thus, the RF power generator may use low-overhead 2-level discrete drain modulation. In doing so, the power generator can maintain high efficiency and perform fast RF power control across a very wide backoff range. In other embodiments, the power generator may have more than two MIDB power amplifier blocks.

In one embodiment, the RF generator may include an impedance transformer that performs adjustments (or a remapping) to match varying load impedances, and in order to provide acceptable operation for the switched-mode power amplifiers. Additionally, the switched-mode power amplifiers themselves may have varying impedances which the impedance transformer may map to the impedance(s) of the load, e.g., plasma generator or another load.

In addition to plasma generation applications, various embodiments of the RF power generator can satisfy the requirements of other industrial applications, e.g., ones that operate at variable load impedances at high frequency (e.g. tens of MHz) and power levels (e.g. peak power in kWs), and wide overall power ranges (e.g. 30 dB) and high peak-to-average power ratios.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, generators, logic, modulators, combiners, transformers, matching networks, drivers and other signal generating and signal processing features of the embodiments disclosed herein may be implemented, for example, in non-transitory logic that may include hardware, software, or both. When implemented at least partially in hardware, the controllers, processors, generators, logic, modulators, combiners, transformers, matching networks, drivers and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, generators, logic, modulators, combiners, transformers, matching networks, drivers and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Various embodiments of the concepts, systems, devices, structures and techniques sought to be protected are described herein with reference to the related drawings. Alternative embodiments can be devised without departing from the scope of the concepts, systems, devices, structures and techniques described herein. It is noted that various connections and positional relationships (e.g., over, below, adjacent, etc.) are set forth between elements in the following description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. Herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal, "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A power generator, comprising:
a plurality of amplifier blocks with at least one of the amplifier blocks comprising a plurality of amplifiers;
a combiner having inputs coupled to respective outputs of the plurality of amplifier blocks, the combiner configured to combine RF signals output from the plurality of amplifier blocks to provide at an output of the combiner an RF output signal, wherein the plurality of amplifier blocks are configured to outphase RF signals from the amplifier blocks based upon at least one phase angle, and wherein at least one of the plurality of amplifier blocks is configured to perform discrete modulation to generate a respective one of the RF signals, the discrete modulation including selecting different combinations of the plurality of amplifiers to change a voltage of the RF output signal in discrete steps; and
a tunable matching network configured to change an output impedance of the combiner in discrete steps to match changes in an impedance of a load.

2. The power generator of claim 1, wherein the tunable matching network is configured to vary one or more shunt reactances to change the output impedance of the combiner in discrete steps to match the changes in the impedance of the load.

3. The power generator of claim 1, wherein:
the output impedance of the combiner changes when different combinations of the plurality of amplifiers are selected for each one of the plurality of amplifier blocks, and
the tunable matching network converts the changing output impedance of the combiner to match the changes in the impedance of the load.

4. The power generator of claim 1, wherein each of the plurality of amplifiers is configured to generate a fixed voltage.

5. The power generator of claim 1, wherein each of the plurality of amplifiers is configured to operate in switched-mode.

6. The power generator of claim 1, wherein the different combinations of the plurality of amplifiers are configured to implement a predetermined sequence of discrete step changes in the RF output signal.

7. The power generator of claim 1, wherein each of the plurality of amplifier blocks is configured to generate a corresponding one of the RF signals based on at least one modulated power supply voltage.

8. The power generator of claim 7, further comprising a discrete drain modulator configured to modulate the power supply voltage via a discrete drain modulation.

9. The power generator of claim 1, wherein each of the plurality of amplifier blocks are configured to operate in common mode.

10. The power generator of claim 1, wherein at least one of the plurality of amplifier blocks is configured to receive a signal, the signal controlling an on state or an off state of the at least one of the plurality of amplifier blocks to change the RF output signal in discrete steps.

11. The power generator of claim 10, wherein the discrete step changes of the RF output signal caused by selecting different combinations of the plurality of amplifiers is different from the discrete step change of the RF output signal caused by controlling the on state or the off state of the at least one of the plurality of amplifier blocks.

12. The power generator of claim 11, wherein the at least one of the plurality of amplifier blocks has one or more transistors and is configurable to be held in the off state by holding at least one of the one or more transistors in a fixed gating state.

13. The power generator of claim 1, wherein the load includes a plasma generator.

14. A method, comprising:
generating a first modulated radio frequency (RF) signal from a first amplifier block;
generating a second modulated RF signal from at least a second amplifier block;
outphasing the first and second modulated RF signals based on a phase angle;
generating, by a combiner, an RF output signal for a load based on the outphased first and second modulated RF signals; and
changing, by a tunable matching network, an output impedance of the combiner in discrete steps to match an impedance of a load.

15. The method of claim 14, wherein changing the output impedance of the combiner in discrete steps to match the impedance of the load comprises varying one or more shunt reactances.

16. The method of claim 14, wherein the first amplifier block and the second amplifier block are comprised of a plurality of amplifiers, wherein the output impedance of the combiner changes when different combinations of the plurality of amplifiers are selected for each one of the plurality of amplifier blocks.

17. The method of claim 16, further comprising:
converting, by the tunable matching network, the changing output impedance of the combiner to match changes in the impedance of the load.

18. The method of claim 14, further comprising:
inputting at least a first supply voltage to the first amplifier block; and
inputting at least a second supply voltage to the second amplifier block,
wherein the first and second supply voltages are discrete drain modulated voltages.

19. The method of claim 14, wherein the first amplifier block has one or more transistors and is configurable to be held in an off state by holding at least one of the one or more transistors in a fixed gating state.

20. The method of claim 14, wherein the load includes a plasma generator.

\* \* \* \* \*